United States Patent
Pfeuffer et al.

(10) Patent No.: US 9,515,232 B2
(45) Date of Patent: Dec. 6, 2016

(54) METHOD OF PRODUCING A MULTICOLOR LED DISPLAY

(71) Applicant: OSRAM Opto Semiconductors GmbH, Regensburg (DE)

(72) Inventors: Alexander F. Pfeuffer, Regensburg (DE); Martin Mandl, Lappersdorf (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 14/414,744

(22) PCT Filed: Jul. 23, 2013

(86) PCT No.: PCT/EP2013/065516
§ 371 (c)(1),
(2) Date: Jan. 14, 2015

(87) PCT Pub. No.: WO2014/016299
PCT Pub. Date: Jan. 30, 2014

(65) Prior Publication Data
US 2015/0207043 A1    Jul. 23, 2015

(30) Foreign Application Priority Data
Jul. 27, 2012  (DE) .................. 10 2012 106 859

(51) Int. Cl.
*H01L 33/50*    (2010.01)
*H01L 27/15*    (2006.01)

(52) U.S. Cl.
CPC .......... *H01L 33/504* (2013.01); *H01L 27/156* (2013.01); *H01L 2933/0041* (2013.01)

(58) Field of Classification Search
CPC ............ H01L 2933/0041; H01L 22/00–22/34
See application file for complete search history.

(56) References Cited

U.S. PATENT DOCUMENTS 5,895,932 A * 4/1999 Bojarczuk, Jr. ....... H01L 33/502
257/102
7,858,403 B2 * 12/2010 Hiller ................... H01L 27/156
257/E33.061

(Continued)

FOREIGN PATENT DOCUMENTS

DE      10312526      10/2003
JP      2006-054470    2/2006

(Continued)

OTHER PUBLICATIONS

English translation of the Notice of Reasons for Rejection dated Sep. 29, 2015 of corresponding Japanese Application No. 2015-523531.

(Continued)

*Primary Examiner* — Joshua King
(74) *Attorney, Agent, or Firm* — DLA Piper LLP (US)

(57) ABSTRACT

A method produces a multicolor LED display, the display including an LED luminous unit having a multiplicity of pixels. First subpixels, second subpixel and third subpixels contain an LED chip that emits radiation of a first color, wherein a first conversion layer that converts the radiation into a second color is arranged at least above the second subpixels and a second conversion layer that converts the radiation into a third color is arranged above the third subpixels. At least one process step is carried out in which the first or second conversion layer is applied or removed in at least one defined region above the pixels, wherein a portion of the LED chips is electrically operated, and wherein the region is defined by the radiation generated by the operated LED chips, generated heat or a generated electric field.

18 Claims, 19 Drawing Sheets

(56) References Cited

U.S. PATENT DOCUMENTS

| | | | |
|---|---|---|---|
| 8,455,903 B2* | 6/2013 | Leatherdale | H01L 27/156 257/98 |
| 8,476,091 B2* | 7/2013 | Hiller | H01L 27/156 257/98 |
| 8,841,146 B2* | 9/2014 | Yen | H01L 33/0095 257/E21.528 |
| 8,941,566 B2* | 1/2015 | Haase | H01L 27/156 345/76 |
| 2002/0015013 A1* | 2/2002 | Ragle | H01L 27/156 345/82 |
| 2002/0171911 A1* | 11/2002 | Maegawa | H01L 33/50 359/308 |
| 2003/0230753 A1 | 12/2003 | Steckl et al. | |
| 2009/0117672 A1* | 5/2009 | Caruso | H01L 33/505 438/7 |
| 2009/0261358 A1* | 10/2009 | Chitnis | H01L 33/0095 257/88 |
| 2010/0102343 A1 | 4/2010 | Ono et al. | |
| 2010/0117997 A1* | 5/2010 | Haase | H01L 27/156 345/204 |
| 2011/0070669 A1* | 3/2011 | Hiller | H01L 27/156 438/16 |
| 2012/0273807 A1* | 11/2012 | Von Malm | H05B 33/10 257/88 |

FOREIGN PATENT DOCUMENTS

| | | |
|---|---|---|
| JP | 2009-158541 | 7/2009 |
| JP | 2010-541284 | 12/2010 |
| JP | 2011-091101 | 5/2011 |
| JP | 2011-519162 | 6/2011 |
| WO | 93/18428 | 9/1993 |
| WO | 97/48138 | 12/1997 |
| WO | 2008/109296 | 9/2008 |
| WO | WO 2008109296 A1 * 9/2008 | H01L 27/156 |

OTHER PUBLICATIONS

Guilhabert, B. et al.: "Organic and inorganic nanostructured colour converters for AlInGaN micropixelated light-emitting diodes", UKNC Meeting, Institute of Physics, University of Oxford, Jan. 8, 2009.

English translation of the Notification of the First Office Action dated Aug. 1, 2016, from corresponding Chinese Application No. 201380039951.3.

* cited by examiner

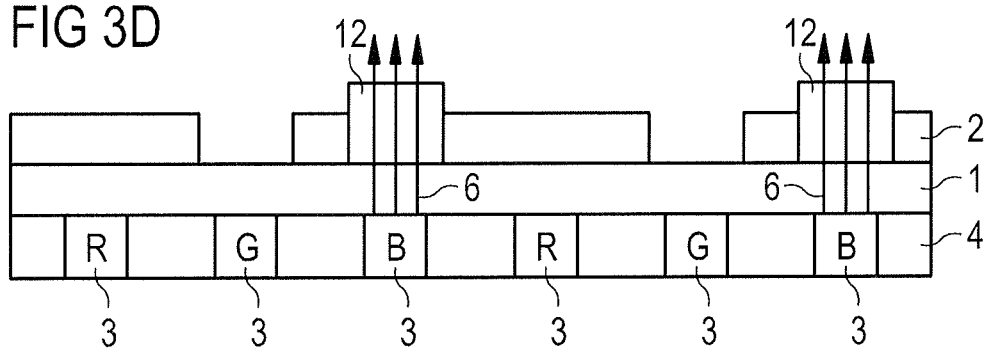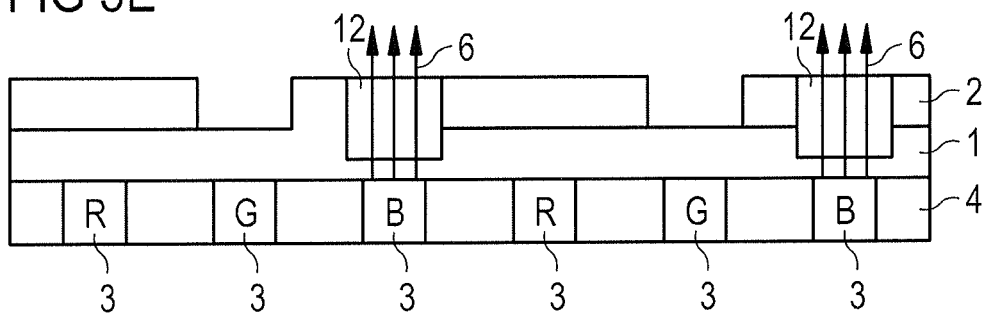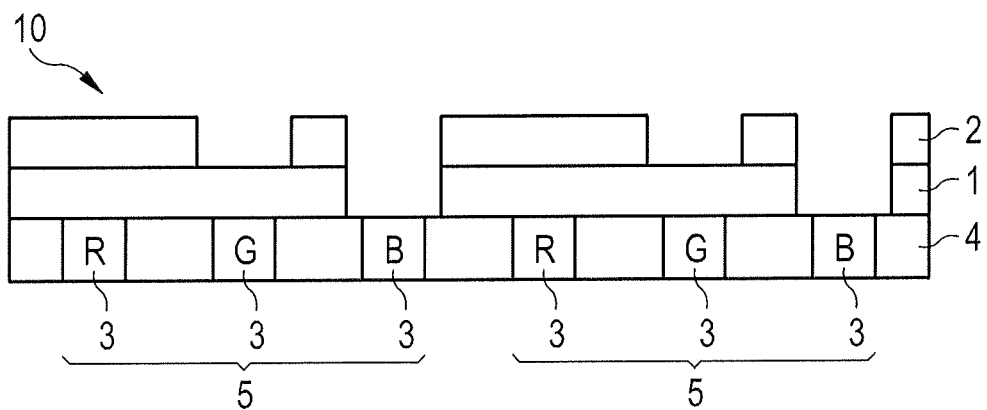

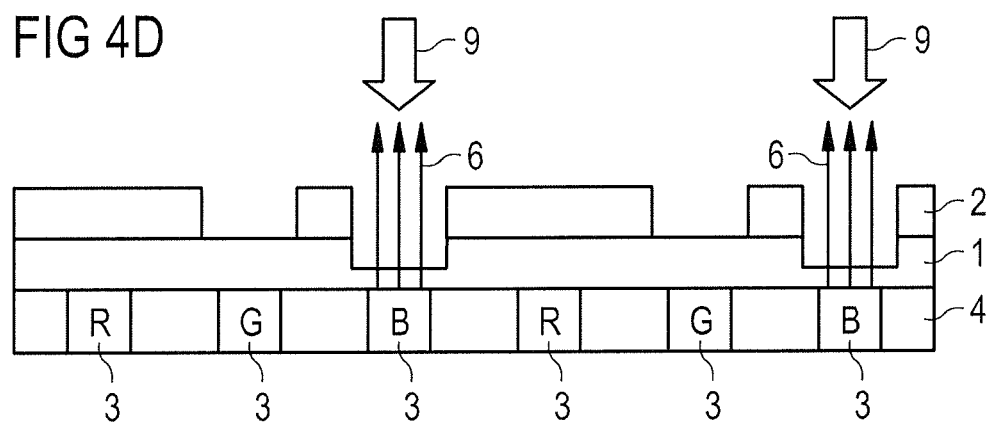
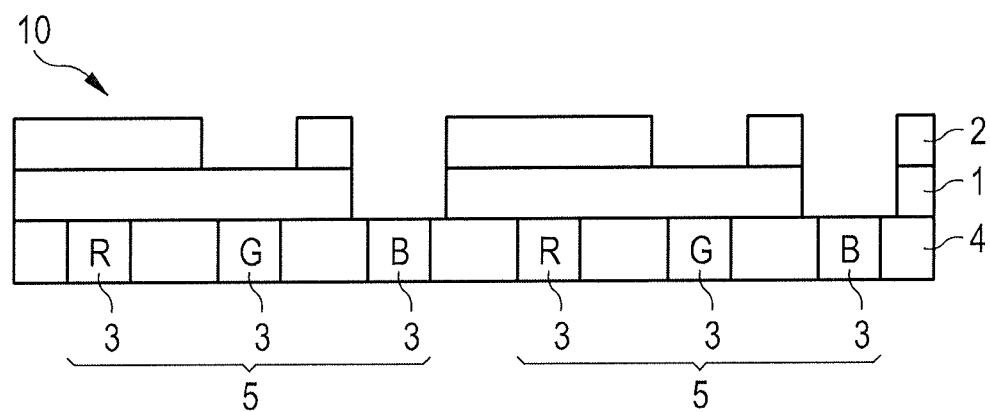

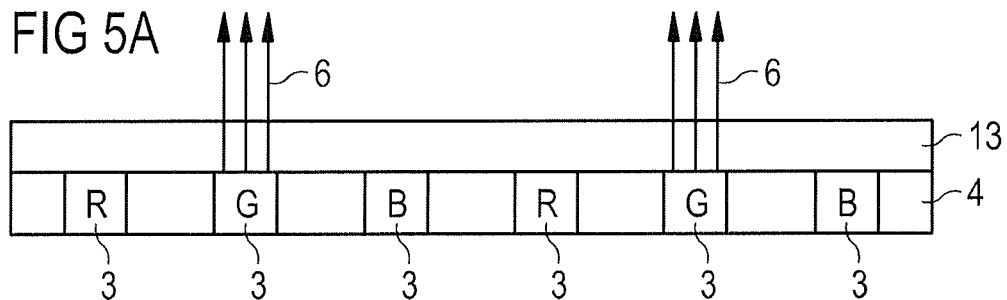
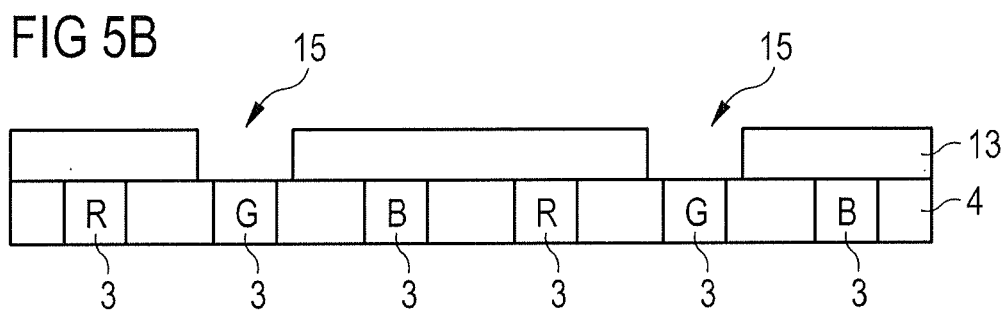
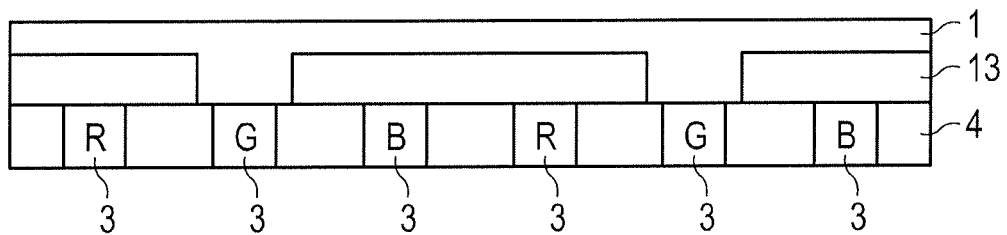
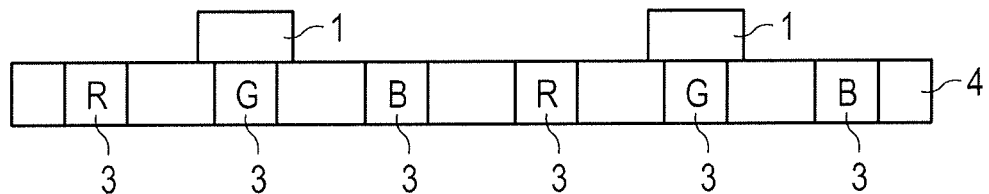

METHOD OF PRODUCING A MULTICOLOR LED DISPLAY

TECHNICAL FIELD

This disclosure relates to a method of producing a multicolor LED display in which light of a plurality of colors is generated using conversion layers.

BACKGROUND

A multicolor LED display can be realized, for example, by virtue of the fact that the pixels of the LED display in each case contain blue-emitting LED chips, wherein a first conversion layer is applied to a first portion of the pixels, the first conversion layer converting the blue light into green light, and a second conversion layer is applied to a second portion of the pixels, the second conversion layer converting the blue light into red light. Alternatively, it is also possible for both a first conversion layer and a second conversion layer to be applied to the second portion of the pixels to convert the blue light into green light by the first conversion layer and to convert the green light into red light by the second conversion layer.

In this way, an RGB display can be realized with a multiplicity of blue-emitting LED chips using two conversion layers.

Suitable conversion substances to convert blue light into green light or blue and/or green light into red light are known per se. The conversion layers containing the conversion substance can be selectively applied to the LED chips, for example, in the form of laminae. However, this is very complex in particular for LED displays comprising two different conversion substances. This method is suitable for LED displays in which the pixels have an edge length of more than 100 µm. A considerable adjustment outlay arises, however, in the case of smaller pixel sizes.

It could therefore be helpful to provide a method of producing a multicolor LED display in which pixels of different colors are produced with a comparatively low production and adjustment outlay, wherein the method is suitable in particular for LED displays having very small pixel sizes.

SUMMARY

We provide a method of producing a multicolor LED display including an LED luminous unit having a multiplicity of pixels, wherein the pixels include first subpixels that emit a first color, second subpixels that emit a second color and third subpixels that emit a third color; the subpixels contain an LED chip that emits radiation of the first color; a first conversion layer that converts radiation of the first color into radiation of the second color is arranged at least above the second subpixels; and a second conversion layer that converts radiation of the first color and/or the radiation of the second color into radiation of the third color is arranged above the third subpixels; including implementing at least one process step in which the first conversion layer or the second conversion layer is applied or removed in at least one defined region above the pixels to arrange the first conversion layer above the second subpixels and arrange the second conversion layer above the third subpixels; a portion of the LED chips electrically operating in the process steps; and defining at least one region by electromagnetic radiation generated by the portion of the LED chips, generated heat or a generated electric field.

BRIEF DESCRIPTION OF THE DRAWINGS

FIGS. 3A to 3F show a schematic illustration of the method in accordance with a further example on the basis of intermediate steps.

FIGS. 4A to 4E show a schematic illustration of the method in accordance with a further example on the basis of intermediate steps.

FIGS. 5A to 5H show a schematic illustration of the method in accordance with a further example on the basis of intermediate steps.

DETAILED DESCRIPTION

Figure 1A:
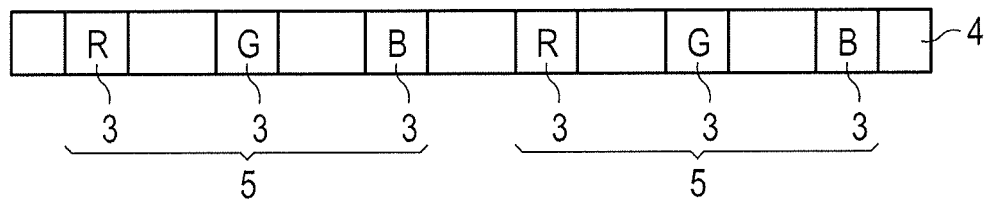
FIGS. 1A to 1F show a schematic illustration of the method in accordance with one example on the basis of intermediate steps.

We provide a method of producing a multicolor LED display wherein the LED display comprises an LED luminous unit having a multiplicity of pixels. The pixels preferably comprise first subpixels that emit a first color, second subpixels that emit a second color and third subpixels that emit a third color. Preferably, the first subpixels emit blue light, the second subpixels emit green light, and the third subpixels emit red light. In particular, the pixels can in each case form a pixel of an RGB LED display.

The subpixels in each case contain an LED chip that emits radiation of the first color. The LED display can contain in particular LED chips based on a nitride compound semiconductor and emit blue light, for example. Preferably, all the LED chips of the LED display emit the light of the first color, in particular blue light. The multicolor nature is advantageously produced in the LED display by a first and/or a second conversion layer arranged on a portion of the subpixels.

In particular, in the method, a first conversion layer that converts radiation of the first color into radiation of the second color is arranged at least above the second subpixels. The first conversion layer can be suitable, for example, to convert blue light emitted by the LED chips into green light.

Furthermore, a second conversion layer that converts radiation of the first color and/or the radiation of the second color into radiation of a third color is advantageously arranged above the third subpixels. The second conversion layer can, for example, convert blue light emitted by the LED chips into red light. In this case, the second conversion layer is advantageously arranged directly above the LED chips of the third subpixels which emit blue light.

Alternatively, however, it is also possible for the second conversion layer to be arranged regionally above the first conversion layer to convert the radiation of the second color into radiation of the third color. By way of example, the second conversion layer can convert green light generated by the first conversion layer into red light. In this case, the third subpixels of the LED display that, for example, emit red light, have both the first conversion layer and the second conversion layer arranged thereabove.

In one configuration of the method, advantageously, no conversion layer is arranged above the first subpixels. The first subpixels therefore emit the unconverted light emitted directly by the LED chips, for example, blue light. Alternatively, however, it would also be possible for a further conversion layer to be arranged above the first subpixels. By way of example, it is possible to use LED chips which emit in the UV spectral range and whose emitted UV light is converted into blue, green and red light by three different conversion layers.

The multicolor LED display need not necessarily be an RGB display, but rather can in particular also have more than three colors. By way of example, in addition to the colors red, green and blue, the multicolor LED display can emit at least one further color such as, for example, yellow light in an RYGB display.

In the method, to arrange the first conversion layer above the second subpixels and arrange the second conversion layer above the third subpixels in each case at least one process step is carried out in which the first conversion layer or the second conversion layer is applied to at least one defined region above the pixels or is removed form a defined region above the pixels. In this process step, advantageously, a portion of the LED chips is electrically operated. The at least one defined region to which the first or second conversion layer is applied or from which the first or second conversion layer is removed is advantageously defined by electromagnetic radiation generated by the electrically operated portion of the LED chips, generated heat or a generated electric field.

The method advantageously uses an operative variable generated during the operation of a portion of the LED chips, in particular the generated radiation, the generated heat or the generated electric field to enable the first and/or second conversion layer to be selectively applied to the subpixels or selectively removed from the subpixels. Since the region to which the first and/or second conversion layer is applied or from which it is removed is defined by operation of a portion of the LED chips, the adjustment outlay in the method is advantageously low. In particular, a step of applying and adjusting a mask can be obviated with the method. The method is therefore particularly advantageous for LED displays having very small pixels in which a considerable adjustment outlay would arise when applying conversion layers using a mask method.

In one configuration of the method, the first conversion layer is arranged above the LED luminous unit and the second conversion layer is arranged above the first conversion layer. In particular, first the first conversion layer can be arranged over the whole area on the LED luminous unit and the second conversion layer can be arranged over the whole area on the first conversion layer.

The first and second conversion layers can be applied successively, for example. Alternatively, the first and second conversion layers can be applied to the LED luminous unit simultaneously, for example, in the form of a prefabricated two-layered converter lamina. The converter lamina can comprise, for example, the first conversion layer which contains a first conversion substance, and a second conversion layer which contains a second conversion substance and connects to the first conversion layer.

In one configuration, the second conversion layer is removed from the first subpixels and the second subpixels. Furthermore, the first conversion layer is removed from the first subpixels.

In this way, both the first and the second conversion layers are removed from the first subpixels. The first subpixels therefore emit the unconverted light of the first color, for example, blue light. Since only the second conversion layer is removed from the second subpixels, the second subpixels emit the light of the second color generated by the first conversion layer, for example, green light. Neither the first nor the second conversion layer is removed from the third subpixels such that the latter emit the light of the third color, for example, red light.

In one configuration, the removal of the first and/or second conversion layer is effected by a method of local layer removal. The method of local layer removal is preferably controlled by a spectrally sensitive optical recognition of the radiation emitted by a portion of the LED chips. The method of local layer removal can be in particular laser ablation or an etching process, preferably a wet-chemical etching process.

The method can be performed, for example, such that after the first and second conversion layers have been applied over the whole area, only the first and second subpixels are switched on, which are luminous with the third color, in particular red, on account of the conversion layers applied above them. The luminous image thus generated can be recorded spectrally sensitively by optical image recognition, for example, and in this way a laser beam can be controlled such that it ablates the red luminous regions of the conversion layers until emission of light in the green spectral range is predominant in these regions. Preferably, the wavelength of the laser used for the laser ablation is chosen such that the absorption takes place only in the second conversion layer.

In a further process step, the first subpixels from which the first conversion layer is also intended to be removed are then switched on. These pixels are luminous with the second color, in particular green, on account of the first conversion layer still present. By laser ablation with a wavelength which preferably leads to a selective absorption in the first conversion layer, the first conversion layer is then locally removed until the switched-on first subpixels predominantly emit light of the first color, in particular blue. The selective removal of the first and/or second conversion layer by laser ablation can advantageously be effected more rapidly and more precisely than, for example, the application of microstructured converter laminae.

In another configuration of the method, a wet-chemical etchant is locally applied above a portion of the subpixels from which the first and/or second conversion layer are/is intended to be removed, for example, by an inkjet method. During application, adjustment is preferably effected by an optical image recognition method involving detection of the light from the LED chips of the respective subpixels. Consequently, the radiation emitted by a portion of the LED chips is utilized to adjust the local application of the etchant.

In a further configuration of the method, the removal of the first and/or second conversion layer is effected by a method for local layer removal advantageously controlled by heat emitted by a portion of the LED chips and/or by emitted electromagnetic radiation. In this case, removal of the first and/or second conversion layer can be effected in particular by a wet-chemical etching method. For this purpose, a wet-chemical etchant whose etching rate at room temperature or in a cooled environment is negligible is preferably selected. After the etchant has been applied, the LED chips of the subpixels from which the first and/or second conversion layer are/is intended to be removed are switched on, as a result of which local heating of the etchant and additionally media transport through convection commence. This leads to a locally greatly increasing etching rate, as a result of which it is possible to obtain a locally delimited removal of the first and/or second conversion layer in the region of the LED chips which are electrically operated.

In a further advantageous configuration of the method, removal of the first and/or second conversion layer is effected by a method for local layer removal advantageously locally amplified by the electric field generated by a portion of the LED chips. In this configuration, the removal of the first and/or second conversion layer is preferably effected by a dry etching method. This variant of the method implements a locally amplified etching of the first and/or second conversion layer in the region of the LED chips of the subpixels which are operated. The locally increased etching rate is based on the influencing of the ions generated during the dry etching process by the electric field of the LED chips. Furthermore, the etching rate of the dry etching process can increase locally as a result of the heat generated by the LED chips.

The above-described variants of the method advantageously in each case use a method for local layer removal, wherein preferably in a first process step, first the first and second subpixels are operated to remove the second conversion layer from these subpixels and, afterward, only the first subpixels are operated also to remove the first conversion layer from the first subpixels. In this way, the first and/or the second conversion layer are/is locally removed in defined regions marked by the radiation generated by a portion of the LED chips, the generated heat or the generated electric field.

In further configurations of the method described below, the first and/or the second conversion layer are/is locally applied in defined regions marked by the radiation emitted by a portion of the LED chips, by the heat emitted by a portion of the LED chips or by the electric field generated by a portion of the LED chips.

In one configuration of the method, a radiation- and/or heat-sensitive layer is applied and altered in regions by the radiation emitted by the portion of the LED chips and/or by the generated heat. In the regions altered by the emitted radiation and/or the generated heat or outside the altered regions, openings are subsequently produced in the radiation- and/or heat-sensitive layer.

In one configuration, the radiation- and/or heat-sensitive layer is a photoresist layer, wherein the photoresist layer is exposed in the regions by the electromagnetic radiation emitted by the portion of the LED chips.

By way of example, a photoresist layer is applied and exposed by the radiation emitted by a portion of the LED chips. Afterward, the photoresist layer is developed and in this way openings are produced at the exposed locations or alternatively at the non-exposed locations. This process can analogously also be brought about by the heat arising locally during operation of a portion of the LED chips or by an interaction of the emitted electromagnetic radiation and the emitted heat, if a heat-sensitive polymer is used as the photoresist layer or instead of the photoresist layer.

The photoresist layer can be a positive resist layer or a negative resist layer. In the positive resist layer, openings are produced at the exposed locations during the development step. By operation of a portion of the subpixels during exposure, therefore, openings can be selectively produced above a desired portion of the subpixels. In an alternative use of a negative resist layer, openings are produced at the non-exposed locations, with the result that, by the operation of a portion of the subpixels during exposure, openings can be selectively produced above the non-operated LED chips.

In one configuration of the method, the photoresist layer advantageously contains no conversion substance. It is indeed possible to introduce a conversion substance into the photoresist layer and directly structure the photoresist layer functioning as a conversion layer in this case by exposure with the LED chips. However, we found that a conversion layer in which the conversion substance is embedded into a resist layer can become brittle or yellow under the action of light. In the method, therefore, advantageously the first and/or the second conversion layer are/is applied in each case in openings of a photoresist layer and the photoresist layer is completely removed again in each case by lift-off technology.

In a further configuration, the radiation- and/or heat-sensitive layer is a heat-sensitive layer, wherein the heat-sensitive layer is altered in regions by heat generated by a portion of the LED chips. The heat-sensitive layer can be decomposed, for example, by the heat generated by the LED chips such that it can be selectively removed in the heated regions in order to produce the openings. In a manner similar to that in a positive photoresist layer, the heat-sensitive layer is removed in the regions altered by the generated heat. Alternatively, the heat-sensitive layer can comprise, for example, a polymer selectively cured by the generated heat, wherein the heat-sensitive layer is subsequently removed to produce the openings in the non-cured regions. In a manner similar to that in a negative photoresist layer, the heat-sensitive layer in this case is removed outside the regions altered by the generated heat.

In one configuration of the method, a radiation-absorbing layer is applied before the heat-sensitive layer is applied. The radiation-absorbing layer preferably converts the radiation emitted by the LED chips into heat. In this way, local heating of the heat-sensitive layer is advantageously amplified in the region of the electrically operated LED chips. The radiation-absorbing layer is advantageously removed again in one of the subsequent method steps.

In one configuration, the first conversion layer or the second conversion layer is applied to the radiation- and/or heat-sensitive layer and removed again outside the openings by lift-off technology.

By way of example, in one method step, the first conversion layer is applied to the radiation- and/or heat-sensitive layer, for example, in the form of a paste containing a first conversion substance. The first conversion layer fills, in particular, the openings produced beforehand. Outside the openings, the conversion layer is removed again by lift-off technology together with the radiation- and/or heat-sensitive layer, for example, a photoresist layer.

In a further step, a second radiation- and/or heat-sensitive layer, for example, a second photoresist layer, is preferably applied. Analogously to the procedure in the previously applied radiation- and/or heat-sensitive layer, openings are subsequently produced in the second radiation- and/or heat-sensitive layer. Subsequently, the second conversion layer is applied and removed again outside of the openings by lift-off technology.

The method steps explained in association with the first conversion layer are therefore repeated to selectively apply the second conversion layer. After removal of the first and/or second radiation- and/or heat-sensitive layer, the first and/or second conversion layer can in each case be baked for stabilization.

In a further configuration of the method, the radiation- and/or heat-sensitive layer is applied to the first conversion layer or to the second conversion layer. The first conversion layer or the second conversion layer is removed after the production of the openings in the radiation- and/or heat-sensitive layer in the openings by a method for layer removal. The method for layer removal is preferably an etching process which can be, for example, a wet-chemical etching process or a dry etching process.

In a further configuration of the method, the first and/or the second conversion layer are/is selectively deposited onto a portion of the subpixels. In this configuration, the first and/or the second conversion layer are/is deposited by electrophoresis, wherein the deposition is locally amplified by the electric field generated by a portion of the LED chips.

In this variant, selective application of the first and/or second conversion layer is effected, for example, by a conversion substance of the first or second conversion layer being applied in a dispersion. The LED chips of the subpixels to which the first or second conversion layer is intended to be applied in the process step are then electrically operated. On account of the electric field that arises during operation of the LED chips, the conversion substance in the dispersion is transported to the switched-on subpixels. In this way, the first and/or second conversion layer are/is deposited in a targeted manner above the subpixels whose LED chips are operated during the electrophoretic deposition.

Subsequently, a drying and/or baking step is preferably carried out. The electrophoretic deposition is preferably carried out successively for the first conversion layer and the second conversion layer. In the electrophoretic deposition of the first and/or second conversion layer, the thickness of the deposited conversion layer can be actively controlled by the switched-on duration of the LED chips during the electrophoretic deposition, as a result of which the color locus can advantageously be influenced in a targeted manner.

In one configuration of the method, an electrically insulating layer is applied to the LED luminous unit before the first and/or second conversion layer are/is applied by electrophoresis. The electrically insulating layer is structured using a radiation- and/or heat-sensitive layer, wherein the radiation- and/or heat-sensitive layer is altered by radiation emitted by the portion of the LED chips and/or by generated heat.

The electrically insulating layer is structured using a photoresist layer, for example, wherein the photoresist layer is exposed by the radiation emitted by a portion of the LED chips.

By way of example, an electrically insulating layer is applied over the whole area before the first and/or second conversion layer are/is applied. A photoresist layer is subsequently applied to the electrically insulating layer, wherein the photoresist layer is exposed by the radiation of the LED chips of the subpixels onto which the first and/or second conversion layer are/is intended to be deposited. By way of example, openings are produced in the exposed regions of the photoresist layer during development, which openings function as an etching mask to produce openings in the electrically insulating layer above the subpixels. The electrophoretic deposition thereupon takes place in the openings of the electrically insulating layer above the subpixels which were electrically operated during exposure. The structured electrically insulating layer advantageously supports the selective deposition of the first and/or second conversion layer in the regions not covered by it.

The method described herein makes it possible to produce, in particular, an RGB LED display, wherein the first color is blue, the second color is green and the third color is red. The RGB LED display can contain in particular blue-emitting LED chips, wherein the first conversion layer converts the blue light into green light and the second conversion layer converts the green and/or blue light into red light.

The method is particularly advantageously suitable for production of LED displays having very small pixel sizes, wherein the pixels can preferably have a width of less than 100 µm.

Our methods are explained in greater detail below on the basis of examples in association with FIGS. 1 to 10.

Identical or identically acting component parts are provided with the same reference signs in the figures. The illustrated component parts and the size relationships of the component parts among one another should not be regarded as true to scale.

FIGS. 1A to 1F illustrate a first example of the method of producing a multicolor LED display.

As illustrated in FIG. 1A, the method involves providing an LED luminous unit 4 having a multiplicity of LED chips 3. The LED luminous unit 4 has a plurality of pixels 5, wherein each pixel 5 has a plurality of subpixels R, G, B for emitting light of different colors. Preferably, each subpixel R, G, B contains an LED chip 3. The LEDs 3 which form the subpixels R, G, B can be driven individually or at least in the groups of the colors provided.

Each of the pixels 5 of the LED luminous unit 4 has three subpixels R, G, B, for example, that emit a first color, a second color and a third color. To simplify the illustration, FIG. 1A illustrates only two pixels 5 each having three subpixels R, G, B, wherein the LED display actually has a multiplicity of such pixels 5. The pixels 5 advantageously each form an image point of the LED display and are preferably arranged in a plurality of lines and columns.

In this example and the examples described below, the multicolor LED display is an RGB LED display in which the first subpixels B emit blue light, the second subpixels G emit green light and the third subpixels R emit red light. Here and hereinafter, the designations R, G, B of the subpixels respectively symbolize the color which this subpixel emits in the finished LED display. The designations R, G, B of the subpixels in particular do not denote the color of the LEDs 3 which form the subpixels. Rather, for all the subpixels identically colored LEDs 3 which emit radiation of a first color, in particular blue light, are preferably used in the LED luminous unit 4. The LED chips 3 can comprise nitride compound semiconductor materials, in particular.

To generate a second color and a third color with the LED chips 3 which emit the first color, two conversion layers 1, 2 are used in the LED display.

Figure 1B:
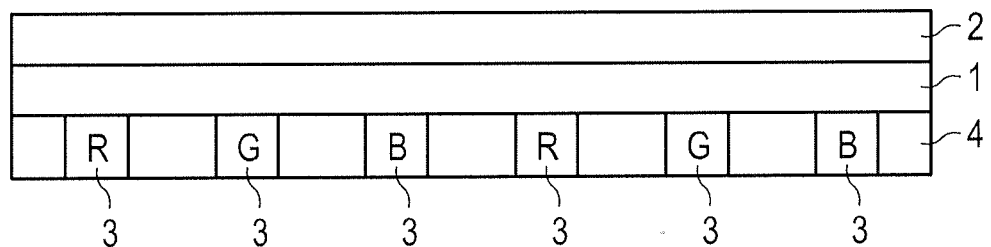

As illustrated in FIG. 1B, in the example the conversion layers 1, 2 are applied to the LED luminous unit 4 over the whole area. The first conversion layer 1 and the second conversion layer 2 can comprise a ceramic lamina, for example, into which a conversion substance is embedded. The first conversion layer 1 converts radiation of the first color emitted by the LED chips 3 into radiation of a second color. By way of example, the conversion layer 1 can convert blue light emitted by the LED chips 3 into green light. In the example, the second conversion layer 2 is arranged above the first conversion layer 1. In this case, the second conversion layer 2 is converts radiation of the second color generated by the first conversion layer 1 into radiation of a third color. In particular, the second conversion layer 2 converts green radiation generated from the blue radiation of the LED chips 3 by the first conversion layer 1 into red radiation. In one configuration, the second conversion layer 2 can also directly convert part of the blue radiation of the LED chips 3 into red radiation.

Suitable conversion substances that, for example, convert blue light into green light, blue light into red light, or green light into red light, are known per se and will therefore not be explained in any greater detail. Suitable matrix materials, in particular ceramics, into which the conversion substances to form a conversion layer 1, 2 can be embedded are likewise known per se and will therefore likewise not be explained in any greater detail at this juncture.

If the LED luminous unit 4 were put into operation after the whole-area application of the first conversion layer 1 and the second conversion layer 2, all the subpixels R, G, B would emit red light on account of the two conversion layers 1, 2. In the method, therefore, as explained in greater detail below, the second conversion layer 2 is removed from the second subpixels G and both the first conversion layer 1 and the second conversion layer 2 are removed from the third subpixels B. For this purpose, in the example in FIG. 1, a method of local layer removal is advantageously used, this method being controlled by a spectrally sensitive optical recognition of the radiation emitted by the LED chips 3.

Figure 1C:
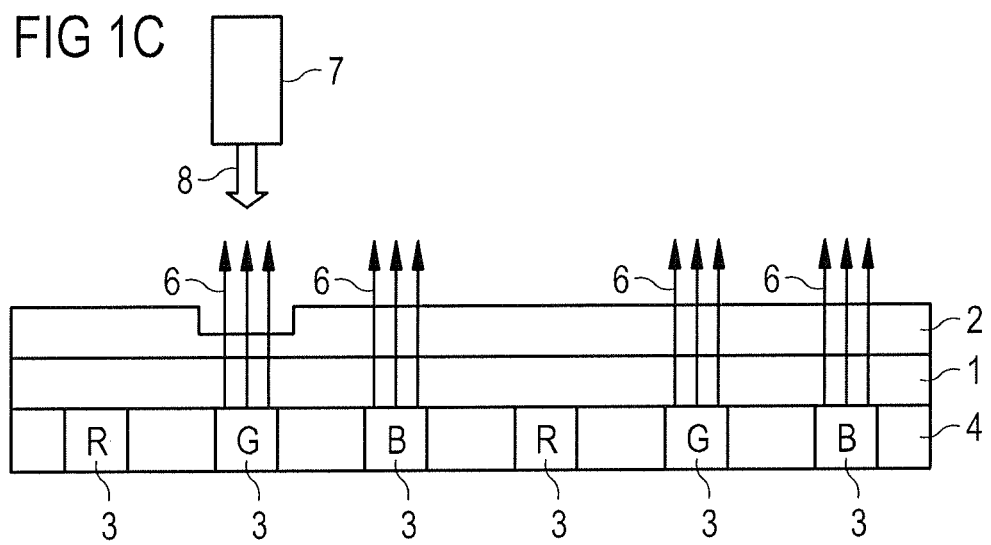

For this purpose, as illustrated in FIG. 1C, in a first step, the LED chips of the second subpixels G and of the third subpixels B are electrically operated, such that they emit radiation 6. The radiation 6 emitted by the LED chips 3 is converted into red light on account of the conversion layers 1, 2. During operation of the subpixels B, G, the second conversion layer 2 is preferably locally removed by laser ablation in the regions in which the radiation 6 is emitted. For this purpose, a laser 7 is used, for example, which emits a laser beam 8 whose wavelength is absorbed in the second conversion layer 2, wherein the second conversion layer 2 is removed in this region by the laser beam 8. A targeted positioning of the laser beam 8 onto a subpixel G to be processed can advantageously be effected by optical image recognition of the emitted radiation 6. The material removal by the laser radiation 8 is effected until the second conversion layer 2 is completely removed in this region. This can be recognized from a change in color of the emitted radiation 6 from red to green. To automatically end the laser ablation process at this point, a spectrally sensitive optical image recognition is advantageously used. In this way, the second conversion layer 2 is sequentially removed for all second subpixels G and third subpixels B of the LED display.

Figure 1D:
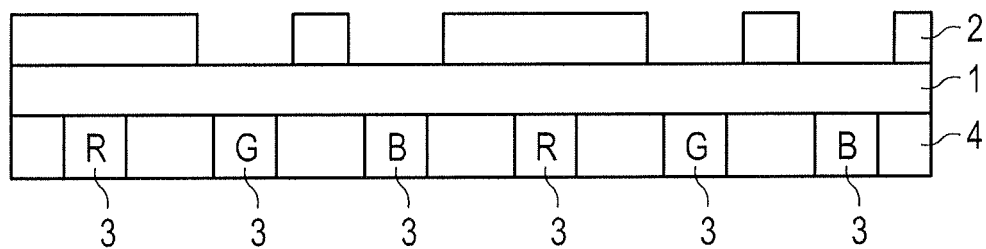

What is achieved in this way is that the second conversion layer 2, as illustrated in FIG. 1D, is substantially removed from the second subpixels G and the third subpixels B.

Figure 1E:
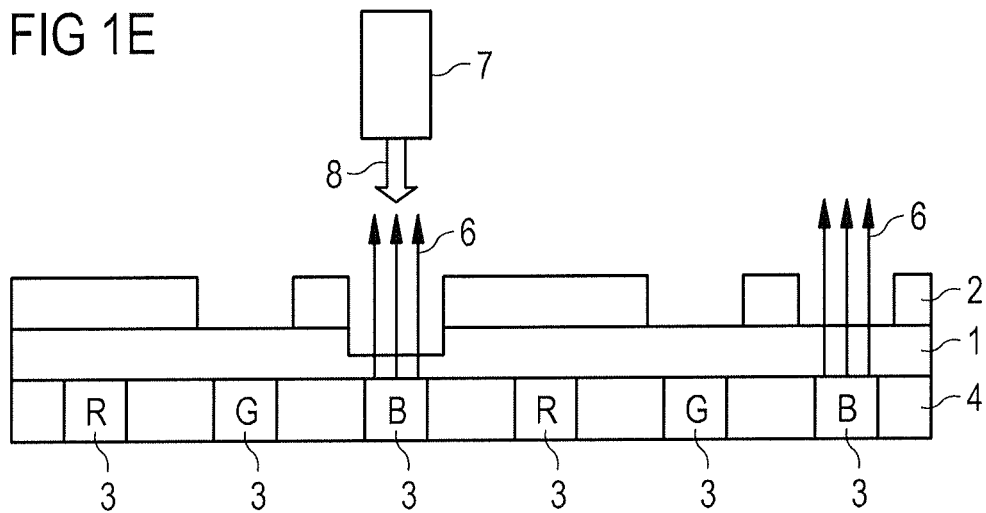

In a further method step, as illustrated in FIG. 1E, the first conversion layer 1 is removed from the third subpixels B. For this purpose, the LED chips 3 of the third subpixels B are electrically operated such that the latter emit green light 6 on account of the first conversion layer 1 still present. As in the method step illustrated in FIG. 1C, material removal of the first conversion layer 1 is effected by laser ablation, wherein the laser beam 8 of the laser 7 used for the material removal is controlled by a spectrally sensitive optical image recognition of the emitted radiation 6. In the method step in FIG. 1E, a laser 7 is advantageously used which emits radiation 8 having a different wavelength than the laser in the case of the method step in FIG. 1C. The material removal is effected, for example, until the blue primary radiation of the LED chip 3 is emitted by the processed subpixel B. With the use of a spectrally sensitive optical image recognition, the material removal can advantageously be terminated in a targeted manner at a point in time at which the emitted radiation 6 attains a desired color locus. The method is carried out sequentially for all third subpixels B until the latter in each case emit blue radiation 6 having a desired color locus.

Figure 1F:
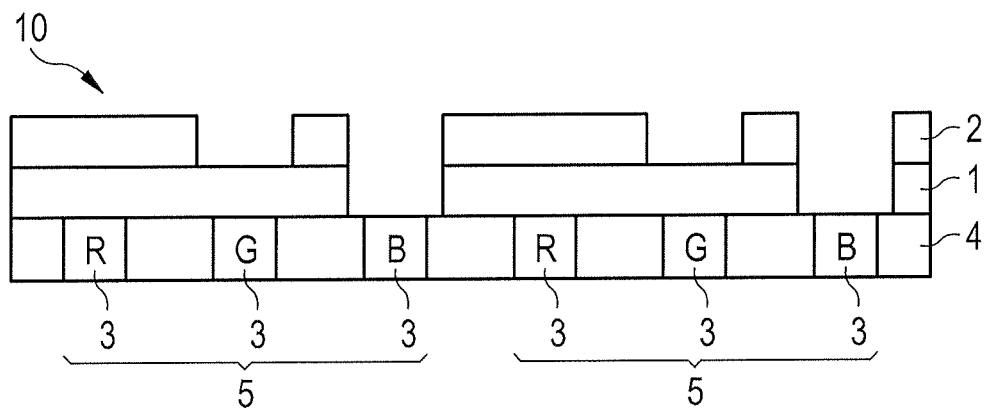

In this way, the multicolor LED display 10 illustrated in FIG. 1F is produced, the display having a plurality of pixels 5, wherein the pixels 5 have three subpixels R, G, B. The first subpixels B emit non-converted light of the LED chips 3, in particular blue light. The second subpixels G emit light of the second color converted by the first conversion layer 1, in particular green light. The third subpixels R emit light of the third color converted by the first conversion layer 1 and the second conversion layer 2, in particular red light.

FIGS. 2A to 2F illustrate a further example of the method wherein the first conversion layer 1 and the second conversion layer 2 are removed from a portion of the subpixels G, B by a method of local layer removal.

Figure 2A:
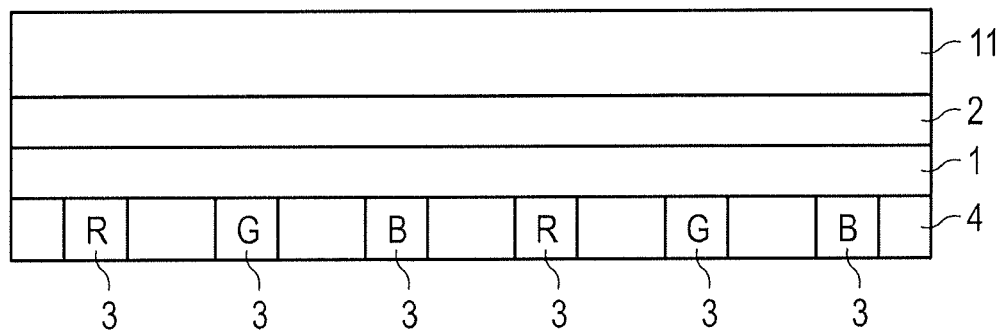
FIGS. 2A to 2F show a schematic illustration of the method in accordance with a further example on the basis of intermediate steps.

As in the example in FIG. 1, in the intermediate step of the method as illustrated in FIG. 2A, the first conversion layer 1 and the second conversion layer 2 have been applied to the LED luminous unit 4 over the whole area. In addition, a preferably liquid etchant 11 has been applied to the second conversion layer 2. The etchant 11 is preferably applied at a temperature at which the etching rate of the etchant is negligibly low. This can take place, for example, at room temperature or in a cooled environment, wherein the etching rate of the etchant 11 at room temperature or in the cooled environment is negligibly low. The temperature of the applied etchant can alternatively be higher than room temperature, provided that the etching rate of the etchant at this temperature is negligibly low.

Figure 2B:
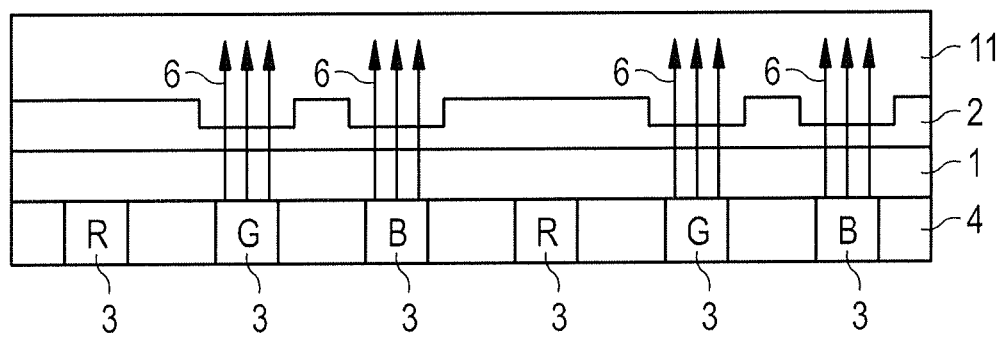

In the intermediate step illustrated in FIG. 2B, the LED chips 3 of the second subpixels G and of the first subpixels B, from which the second conversion layer 2 is intended to be removed, are thereupon electrically operated. By virtue of the heat generated by the LED chips 3 of the subpixels G, B, the etchant 11 heats up to a great extent locally above the subpixels G, B such that the etching rate rises there and leads to a local removal of the second conversion layer 2 in these regions.

Alternatively or additionally, the etching rate can be locally increased by the radiation 6 emitted by the subpixels G, B. A so-called photo-assisted etching process is involved in this case.

In this example of the method, the layer removal advantageously takes place from all electrically operated subpixels G, B simultaneously. As in the first example, the layer removal process can be controlled over time by a spectrally sensitive optical image recognition, wherein the etching process is terminated if no longer red light but rather predominantly green light is emitted in the regions of the subpixels G, B. The etching process can be terminated by the subpixels G, B being switched off by the application of a neutralization agent and/or by rinsing.

Figure 2C:
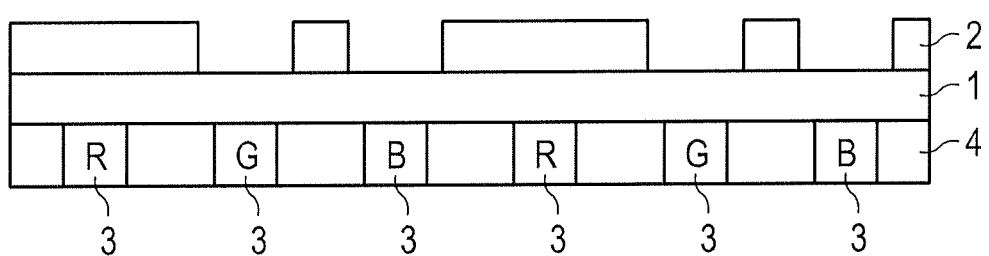

What is achieved in this way is that the second conversion layer 2 is removed from the subpixels G, B, as illustrated in FIG. 2C.

Figure 2D:
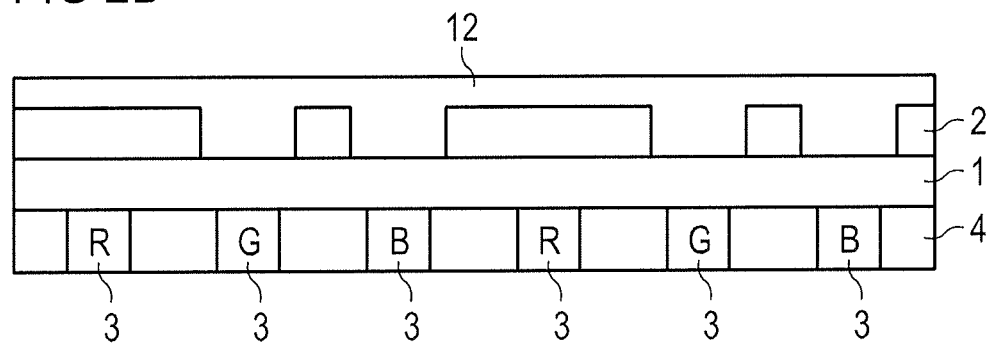

Afterward, as illustrated in FIG. 2D, a further preferably liquid etchant 12, that selectively etches the first conversion layer 1, is applied preferably at room temperature or in a cooled environment. Like the first etchant 11 used previously, the second etchant 12, too, is advantageously applied at a temperature at which the etching rate of the etchant is negligibly low.

Figure 2E:
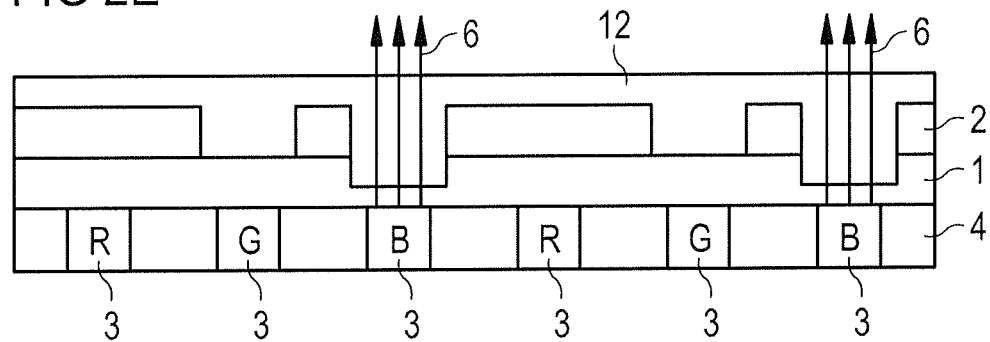

As illustrated in FIG. 2E, subsequently, the LED chips 3 of the first subpixels B are electrically operated, wherein, as a result of the local evolution of heat, the etching rate rises to a great extent above the subpixels B and thus leads to removal of the first conversion layer 1. As in the intermediate step illustrated in FIG. 2B, the etching process can be controlled by spectrally sensitive optical image recognition, wherein the etching process is preferably terminated if the color of the emitted radiation has changed from green to blue.

Figure 2F:
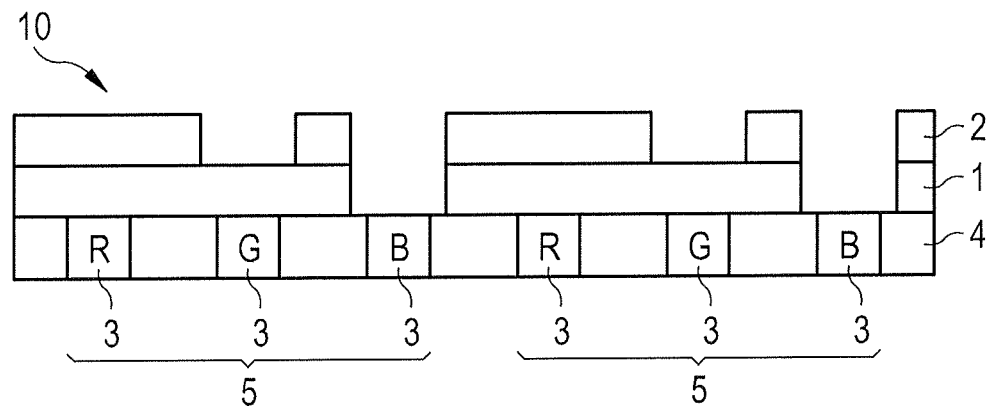

The multicolor LED display 10 completed in this way is illustrated in FIG. 2F and corresponds to the LED display illustrated in FIG. 1F.

Figure 3A:
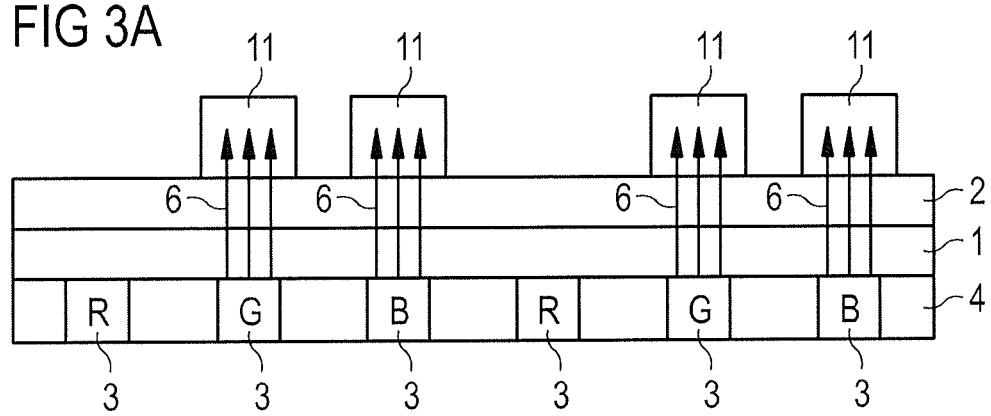

A further example of the method is illustrated in FIGS. 3A to 3F. This example is a modification of the example illustrated in FIGS. 2A to 2F wherein a local layer removal of the first conversion layer 1 and of the second conversion layer 2 is effected by etchants 11, 12. As illustrated in FIG. 3A, however, the first etchant 11 is not applied to the second conversion layer 2 over the whole area, but rather locally above the subpixels G, B above which the second conversion layer 2 is intended to be removed. The local application of the etchant 11 can be effected by an inkjet method, for example. In this configuration, the LED chips 3 of the second subpixels G and of the third subpixels B are advantageously electrically operated during the application of the etchant 11 such that the local application can advantageously be controlled by optical image recognition of the emitted radiation 6.

Figure 3B:
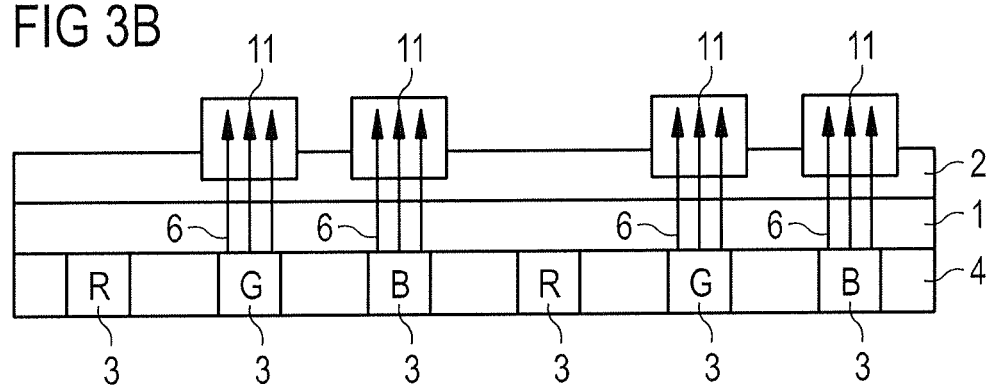

As in the previous example in FIG. 2, the local layer removal of the second conversion layer 2 illustrated in FIG. 3B can be effected under the influence of the heat and/or radiation generated during the operation of the LED chips 3 of the subpixels G, B. In contrast to the example in FIG. 2, the local application of the etchant 11 enables control of the etching process, in particular termination at a desired point in time, by an accurate apportioning of the etchant 11. A control of the etching process by emitted heat and/or radiation is therefore not absolutely necessary. It is also possible for small amounts of the etchant 11 to be applied repeatedly, for example, to set the color locus of the subpixels G, B in a targeted manner. In an etching rate greatly increased by heat, the etching process can be ended by the subpixels G, B being switched off. Alternatively, the etching process can be terminated by rinsing or application of a neutralization agent after a desired etching depth and/or a desired color locus have/has been attained.

Figure 3C:
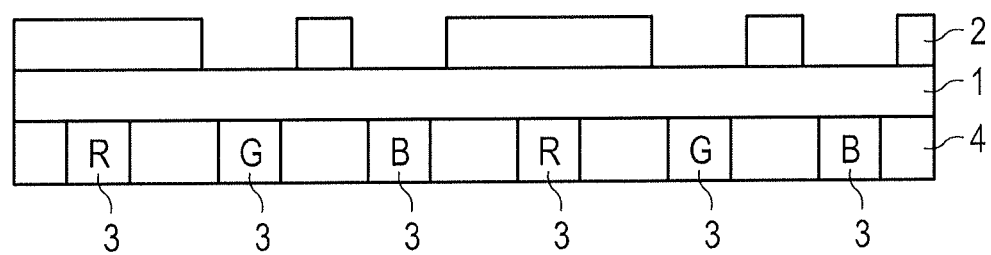

In this way, in particular, as illustrated in FIG. 3C, the second conversion layer 2 can be removed from the second subpixels G and the first subpixels B.

As illustrated in FIG. 3D, the method is continued correspondingly with a second etchant 12, that etches the first conversion layer 1. The second etchant 12 is locally applied to the first subpixels B, wherein the local application can be effected by an inkjet method and can be supported by an optical image recognition of the radiation 6 emitted by the LED chips 3 of the first subpixels B.

Afterward, as illustrated in FIG. 3E, the local layer removal of the second conversion layer 2 is effected by the second etchant 12.

In this way, the multicolor LED display 10 illustrated in FIG. 3F is produced, which corresponds to the examples in FIGS. 1F and 2F.

A further example of the method wherein a local layer removal of the first conversion layer 1 and of the second conversion layer 2 is effected is illustrated in FIGS. 4A to 4E.

Figure 4A:
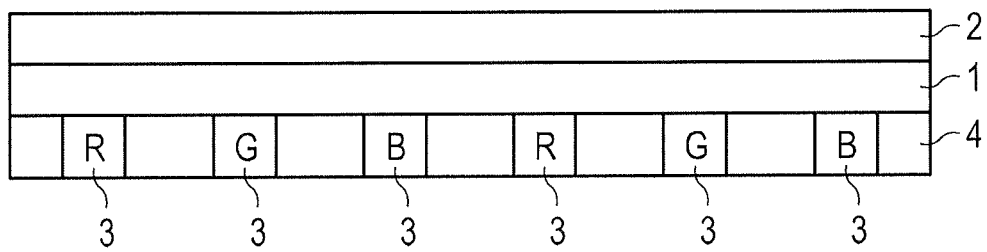
Figure 4B:
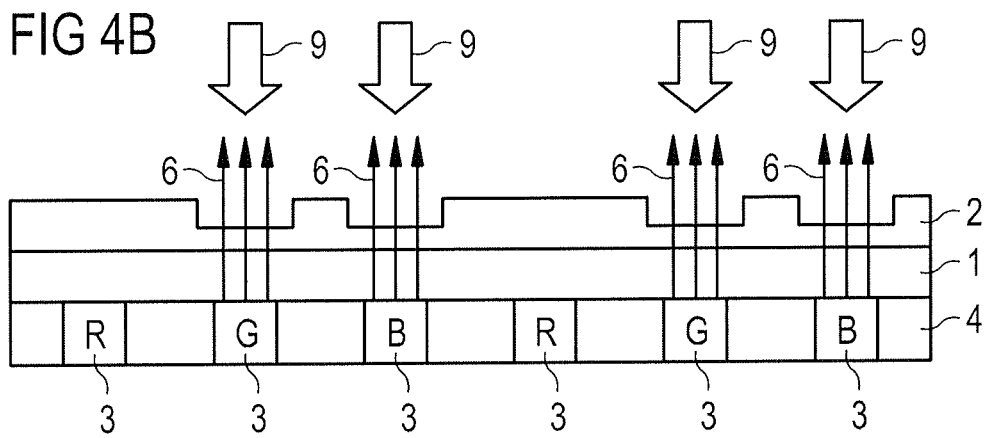

As in the previous examples, after the application of the conversion layers 1, 2 as illustrated in FIG. 4A, first a local layer removal of the second conversion layer 2 is effected, which is illustrated in FIG. 4B. The LED chips 3 of the first and second subpixels B, G, from which the second conversion layer 2 is removed, are electrically operated in this process step. The layer removal is effected by a dry etching process, symbolized by the arrows 9. In this variant of the method, a locally amplified etching of the second conversion layer above the electrically operated subpixels G, B is obtained by the electric field generated during the operation of the LED chips 3 of the subpixels B, G. Furthermore, the heat generated by the LED chips 3 during operation can locally amplify the dry etching process.

Figure 4C:
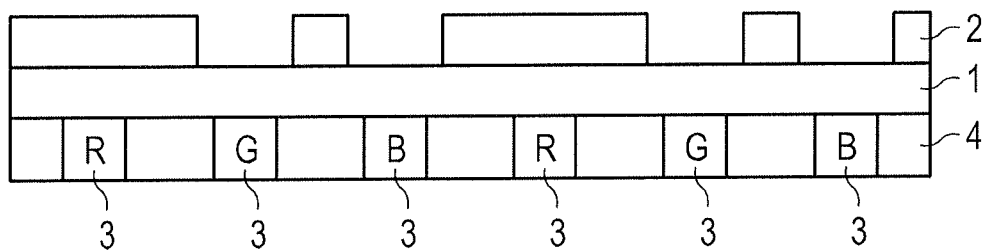

In this way, as illustrated in FIG. 4C, first the second conversion layer 2 is removed from the second subpixels G and the first subpixels B.

In a further step, illustrated in FIG. 4D, only the first subpixels B are electrically operated, wherein the first conversion layer 1 is selectively removed from the first subpixels B by a further dry etching process 9. The locally amplified etching rate above the subpixels B is once again brought about by the electric field generated by the LED chips 3 of the subpixels B and by the locally emitted heat.

In this way, the multicolor LED display 10 illustrated in FIG. 4E is produced, which corresponds to the multicolor LED displays of the previous examples.

Figure 5E:
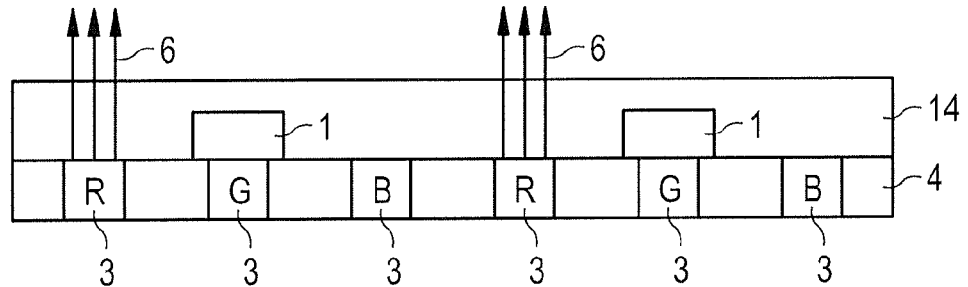

A further example of the method is illustrated in FIGS. 5A to 5H. As illustrated in FIG. 5A, in this example, first a first photoresist layer 13 is applied to the LED luminous unit 4. The first photoresist layer 13 can be applied by spin-coating, for example. The photoresist layer 13 is subsequently exposed by radiation emitted by the LED chips 3 of the second subpixels G. This process can analogously also be brought about by the heat that arises locally during operation of a portion of the LED chips 3 or by an interaction of the emitted electromagnetic radiation and the emitted heat, if a heat-sensitive polymer is used as the photoresist layer or instead of the photoresist layer.

In the method step illustrated in FIG. 5B, development of the photoresist layer 13 produces openings 15 above the subpixels G whose LED chips 3 were operated during the exposure of the photoresist layer 13.

In a further method step illustrated in FIG. 5C, the first conversion layer 1 is applied to the structured photoresist layer 13. The first conversion layer 1 is subsequently removed again together with the photoresist layer 13 outside the openings produced previously.

As illustrated in FIG. 5D, after lift-off of the photoresist layer 13, regions of the first conversion layer 1 remain above the subpixels G whose LED chips 3 were used previously to expose the photoresist layer 13.

The previous method steps can subsequently be repeated correspondingly to apply a second conversion layer 2. In this regard, in the method step illustrated in FIG. 5E, a second photoresist layer 14 is applied to the structured first conversion layer 1 produced previously and is exposed by the radiation 6 from the LED chips 3 of the subpixels R to which the second conversion layer is intended to be applied.

Figure 5F:
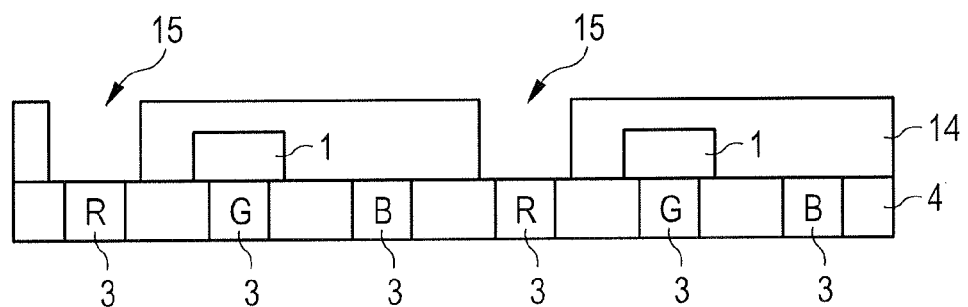

In the method step illustrated in FIG. 5F, development of the second photoresist layer 14 produces openings 15 in the exposed regions above the third subpixels R.

Figure 5G:
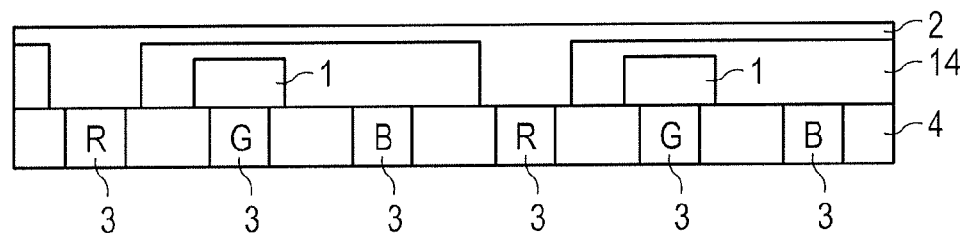

In the intermediate step illustrated in FIG. 5G, the second conversion layer 2 is applied to the second photoresist layer 14 thus structured. In the example, the second conversion layer 2 converts the radiation of the first color of the LED chips, for example, blue light, into radiation of the third color, for example, red light.

After the second conversion layer 2 has been applied, the second photoresist layer 14 is removed by lift-off technology including the regions of the second conversion layer 2 arranged thereabove.

Figure 5H:
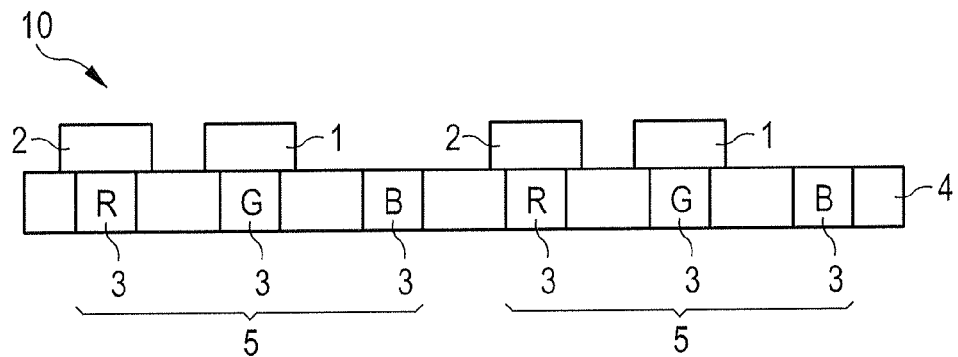

After this method step has been carried out, as illustrated in FIG. 5H, regions of the second conversion layer 2 remain above the third subpixels R used previously to expose the second photoresist layer 14. In the multicolor LED display 10 produced in this way, the first conversion layer 1 is arranged above the second subpixels G such that the second subpixels G emit the converted radiation of the second color, in particular green light. The second conversion layer 2 is arranged above the third subpixels R such that the third subpixels R emit radiation of the third color, in particular red light.

Alternatively, in the example in FIG. 5, it would also be possible as in the previous examples to use a second conversion layer 2 that converts radiation of the second color, for example, green light, into radiation of the third color, for example, red light. In this case, in the method steps in FIGS. 5A to 5D, the first conversion layer 1 would be applied above the second and third subpixels R, G and, in the method steps in FIGS. 5E to 5H, the second conversion layer 2 would be applied above the first conversion layer 1 of the third subpixels R.

In the method illustrated in FIGS. 5A to 5H, the photoresist layers 13, 14 used were positive photoresist layers in which openings 15 arise during development in the exposed regions. Alternatively, it would also be possible to use negative resist layers as photoresist layers 13, 14 in which openings are produced in the non-exposed regions during development. Accordingly, in this variant of the method (not illustrated), in the method step illustrated in FIG. 5A the subpixels R, B above which a first conversion layer is not intended to be deposited would have to be electrically operated. Furthermore, in the method step illustrated in FIG. 5E the subpixels G, B above which the second conversion layer 2 is not intended to be deposited would have to be electrically operated. The remaining method steps, with the use of negative resist layers, correspond to the intermediate steps of the example illustrated in FIG. 5.

A further example of the method of producing a multicolor LED display is illustrated in FIGS. 6A to 6F.

Figure 6A:
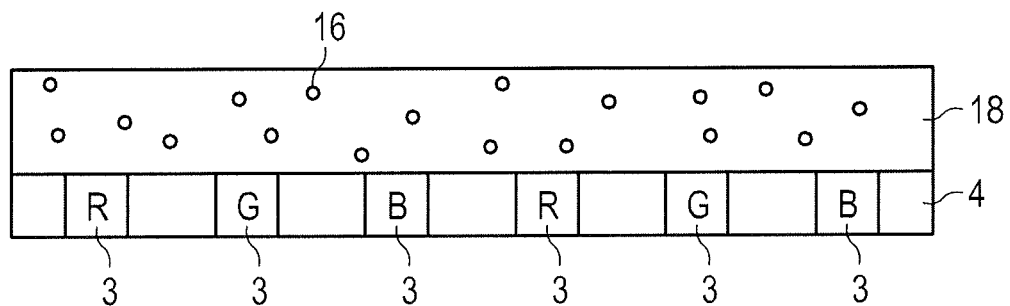
FIGS. 6A to 6F show a schematic illustration of the method in accordance with a further example on the basis of intermediate steps.

In the method step illustrated in FIG. 6A, a first conversion substance 16 in a dispersion 18 is applied to the LED luminous unit 4. The first conversion substance 16 is, for example, a conversion substance that converts blue light emitted by the LED chips 3 into green light. The first conversion substance 16 is deposited onto the subpixels G in the form of a first conversion layer.

Figure 6B:
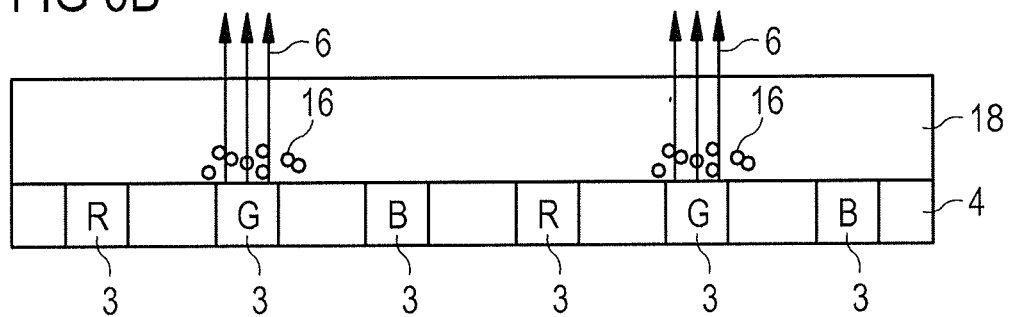

The targeted deposition of the conversion substance 16 on the subpixels G is effected as illustrated in FIG. 6B by an electrophoretic deposition in which the LED chips 3 of the subpixels G are electrically operated. During operation, the LED chips 3 of the subpixels G generate an electric field which brings about a deposition of the conversion substance 16 on the subpixels G.

Figure 6C:
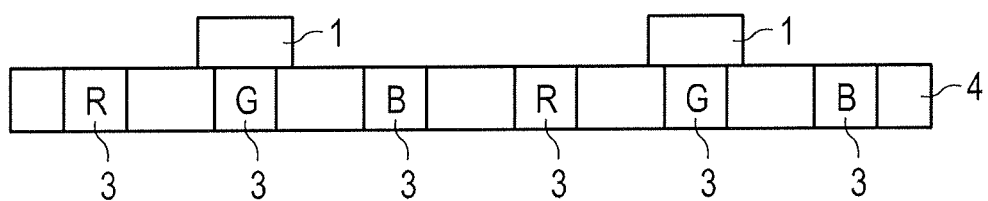

Afterward, a drying step and preferably a baking step take place to form the first conversion layer 1 above the subpixels G from the conversion substance 16 deposited in the dispersion 18, as is illustrated in FIG. 6C.

Figure 6D:
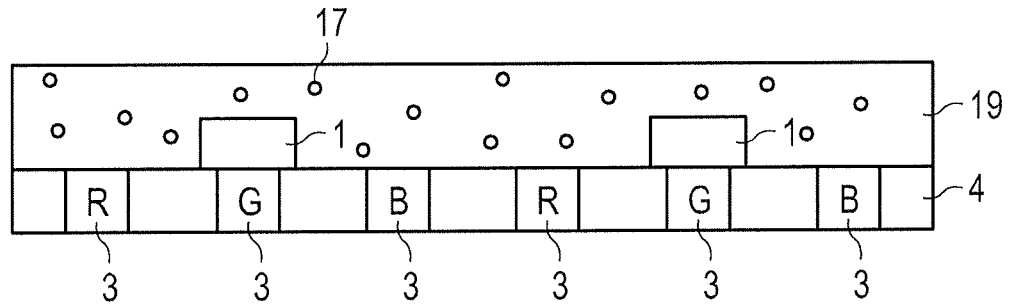

As illustrated in FIG. 6D, a second dispersion 19 containing a second conversion substance 17 is subsequently applied. The second conversion substance 17, for example, converts the blue radiation emitted by the LED chips 3 into red light.

Figure 6E:
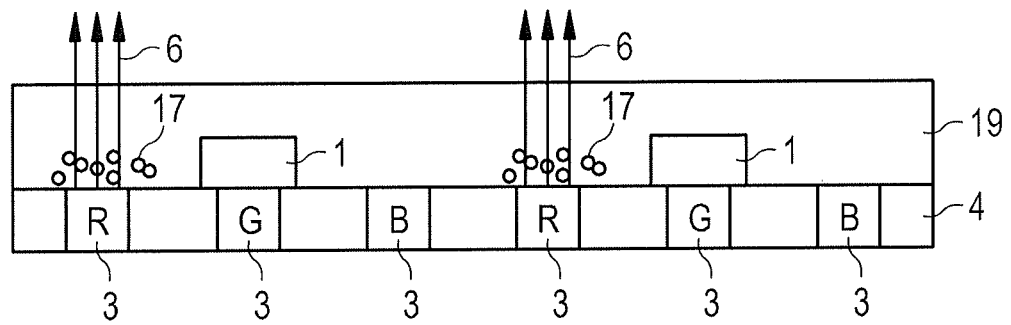

As illustrated in FIG. 6E, the second conversion substance 17 is deposited electrophoretically above the subpixels R by virtue of the LED chips 3 of the subpixels R being electrically operated and in this way generating an electric field which leads to the deposition of the second conversion substance 17 above the subpixels R.

Figure 6F:
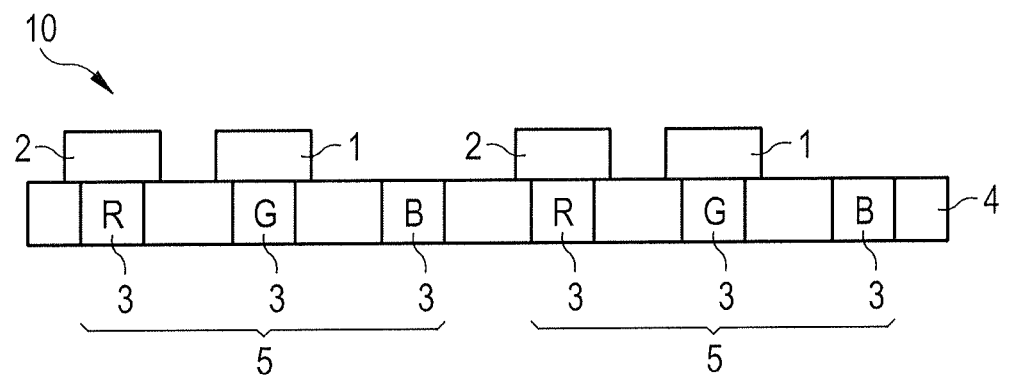

After a further drying process and preferably a further baking process, the multicolor LED display 10 illustrated in FIG. 6F is produced, in which the first conversion layer 1 that converts blue light into green light is arranged above the second subpixels G and the second conversion layer 2 that converts blue light into red light is arranged above the third subpixels R. As in the example in FIG. 5, in this example the second conversion layer 2 directly converts blue light into red light. Alternatively, however, it would also be possible to apply to the third subpixels R a first conversion layer 1 which converts blue light into green light, and to apply thereto the second conversion layer 2 which converts green light into red light.

FIGS. 7A to 7J illustrate a further example of the method, this being a modification of the example of the method as illustrated in FIG. 6.

Figure 7A:
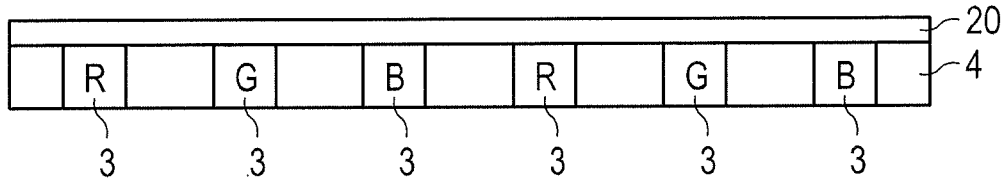
FIGS. 7A to 7J show a schematic illustration of the method in accordance with a further example on the basis of intermediate steps.

In the first method step of the example as illustrated in FIG. 7A, an electrically insulating layer 20 is applied to the LED luminous unit 4. The electrically insulating layer 20 can be in particular an oxide or nitride layer, for example, a silicon oxide layer. The insulating layer 20 can be a protective passivation which is usually a constituent part of the LED chips 3. It is also possible for at least one further layer, for example, a layer composed of a transparent conductive oxide, to be situated between the LED chips 3 and the insulating layer 20.

Figure 7B:
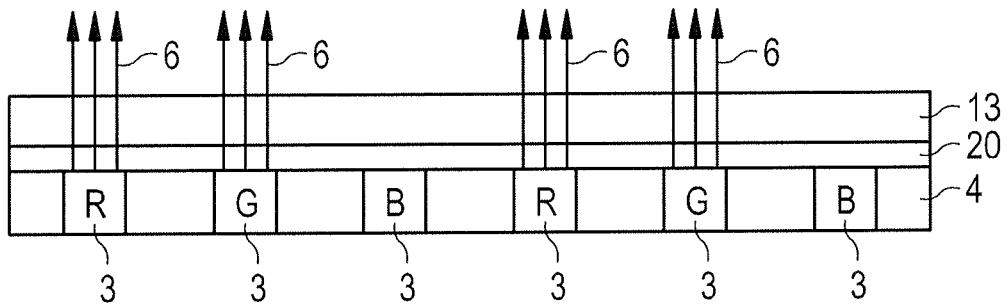

In a further method step illustrated in FIG. 7B, a photoresist layer 13 is applied to the electrically insulating layer 20 and exposed by the radiation 6 emitted by the LED chips 3 of the second and third subpixels R, G.

Figure 7C:
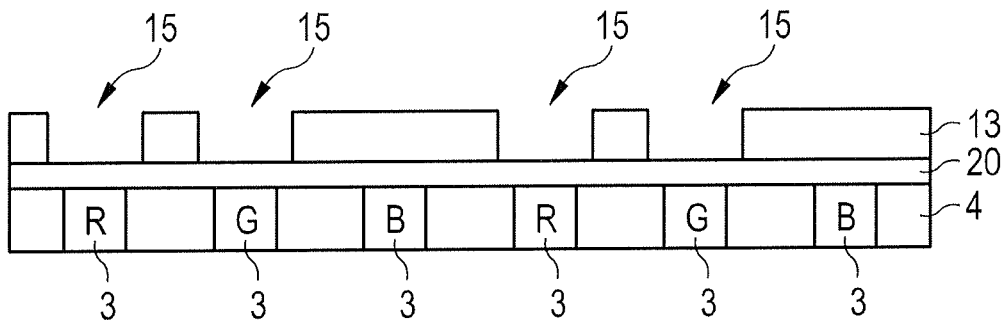

As illustrated in FIG. 7C, the photoresist layer 13 is subsequently developed and openings 15 are thereby produced above the subpixels R, G which were electrically operated during exposure. As an alternative to the method steps in FIGS. 7A to 7C, it would also be possible to produce the openings 15 above the second and third subpixels R, G in separate method steps.

The photoresist layer 13 structured in this way is used as an etching mask for structuring the underlying electrically insulating layer 20.

Figure 7D:
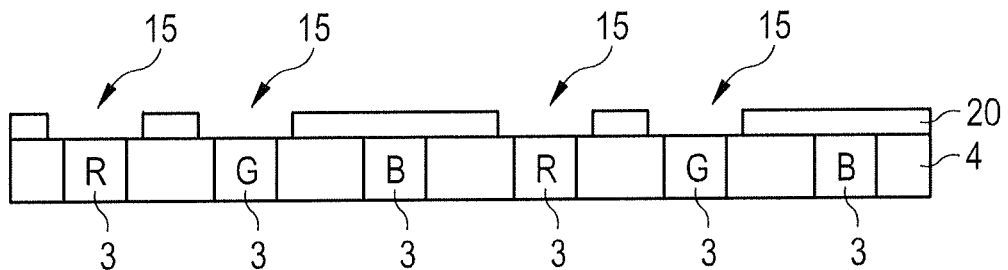
Figure 7E:
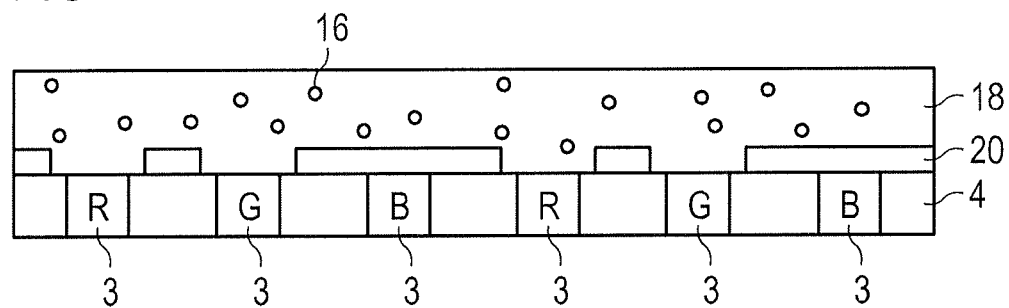

In this way, as illustrated in FIG. 7D, a structured electrically insulating layer 20 is produced which has openings 15 above the second and third subpixels R, G, above which a conversion layer is intended to be deposited.

The further method steps illustrated in FIGS. 7E to 7J correspond to the method steps of the previous example as illustrated in FIGS. 6A to 6F, with the difference that the structured electrically insulating layer 20 is situated on the LED luminous unit 4.

Figure 7F:
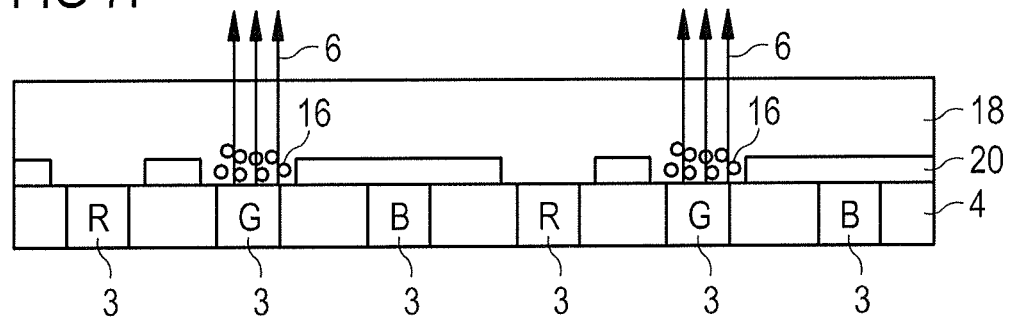
Figure 7G:
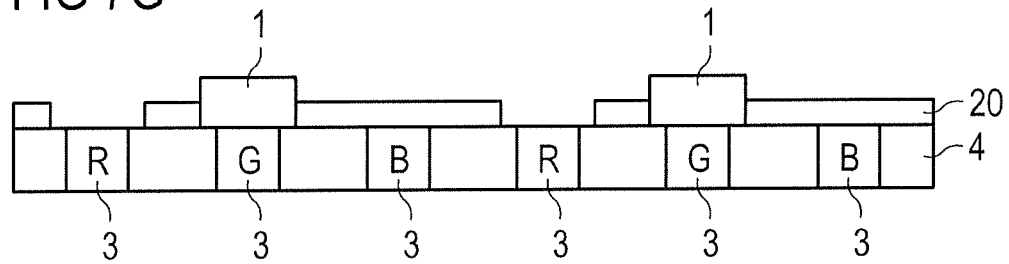
Figure 7H:
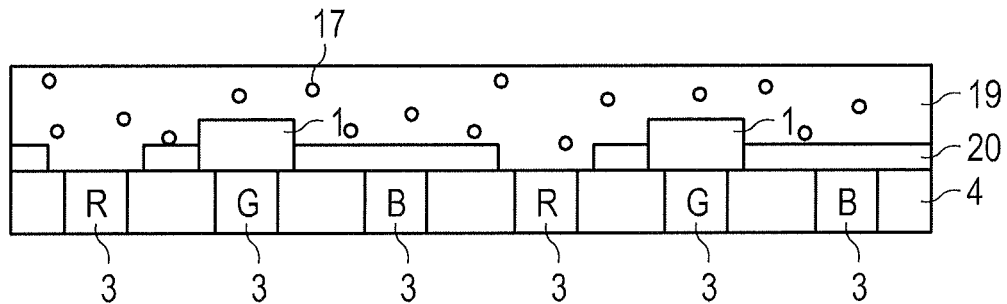
Figure 7I:
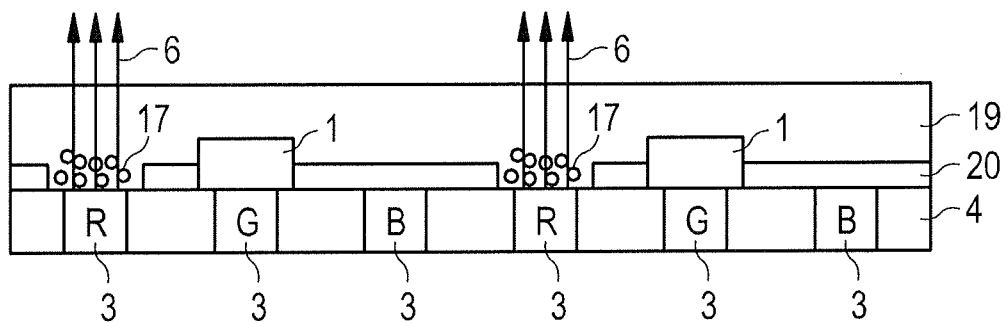
Figure 7J:
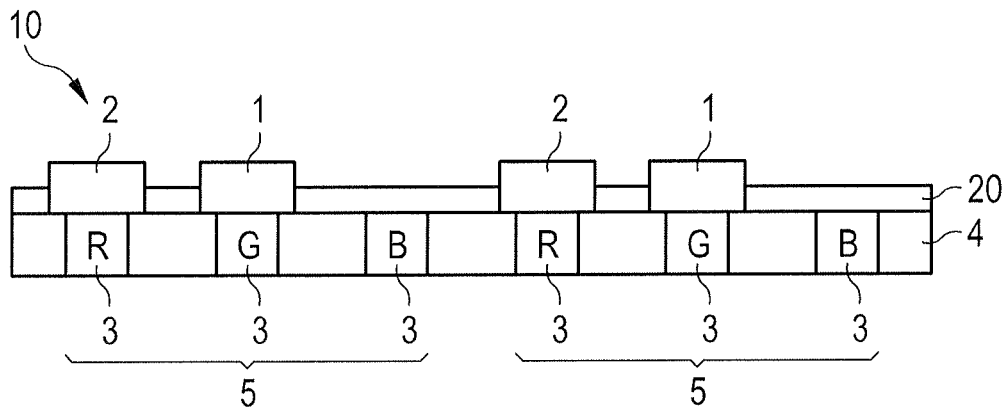

The first conversion layer 1 and the second conversion layer 2 are deposited above the subpixels R, G by electrophoretic deposition as in the example in FIG. 6. During the electrophoretic deposition of the first conversion substance 16 above the second subpixels G, which is illustrated in FIG. 7F, and the electrophoretic deposition of the second conversion substance 17 above the third subpixels R, which is illustrated in FIG. 7I, the advantage of the structured electrically insulating layer 20 applied previously is that the electrophoretic deposition above the electrically conductive material of the subpixels R, G is promoted compared to the regions of the electrically insulating layer 20. The surfaces of the subpixels R, G can be formed in particular by the electrically conductive material of the LED chips 3 which form the subpixels R, G.

The remaining method steps of the example in FIG. 7 correspond to the example illustrated in FIG. 6 and will therefore not be explained again.

Figure 8A:
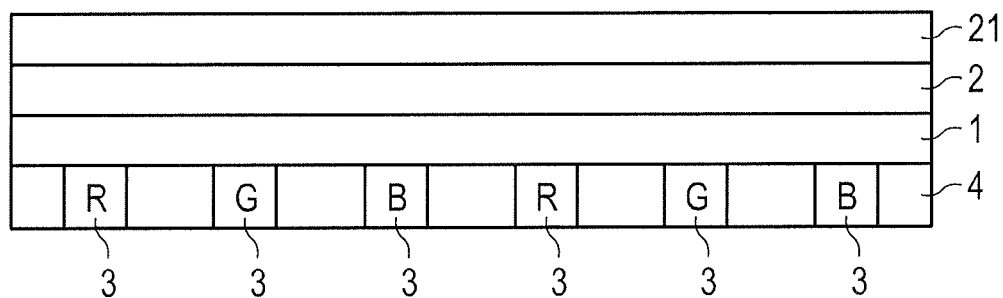
FIGS. 8A to 8I show a schematic illustration of the method in accordance with a further example on the basis of intermediate steps.

A further example is illustrated in FIGS. 8A to 8I. As illustrated in FIG. 8A, in the example in a first step the conversion layers 1, 2 are applied to the LED luminous unit 4 over the whole area. A radiation- and/or heat-sensitive layer 21 is applied to the second conversion layer 2.

Figure 8B:
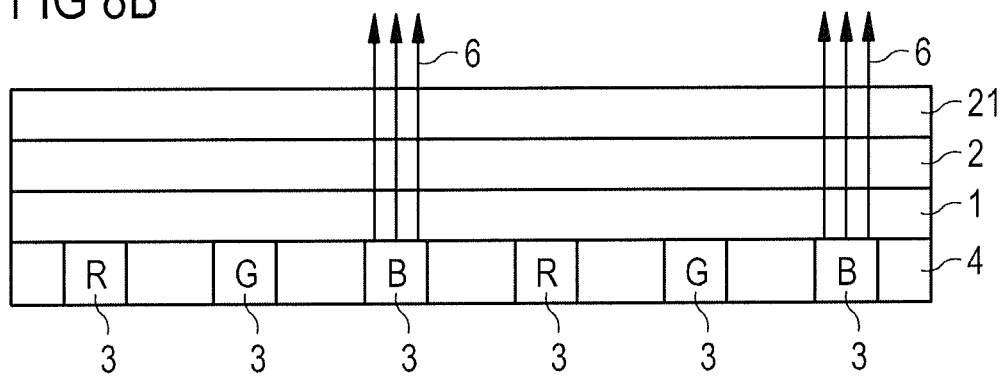

As illustrated in FIG. 8B, the radiation- and/or heat-sensitive layer 21 is subjected to the action of the heat and/or radiation 6 emitted by the LED chips 3 of the first subpixels B.

Figure 8C:
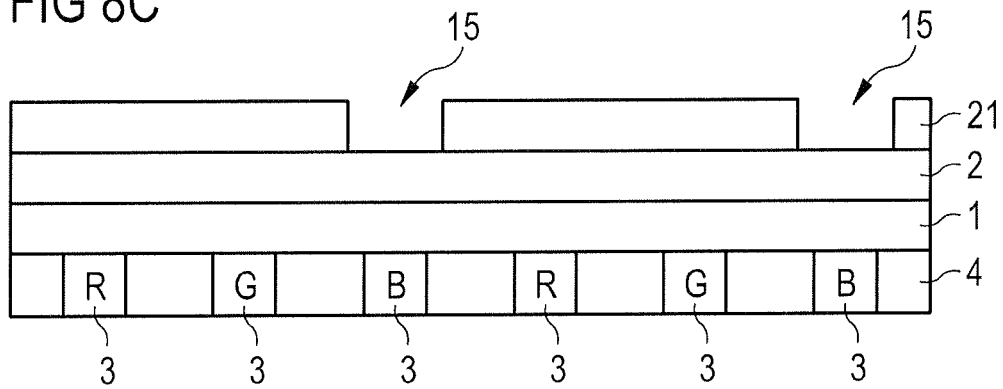

The radiation- and/or heat-sensitive layer 21 is subsequently structured, for example, by a development process such that it has openings 15 above the first subpixels B as illustrated in FIG. 8C.

Figure 8D:
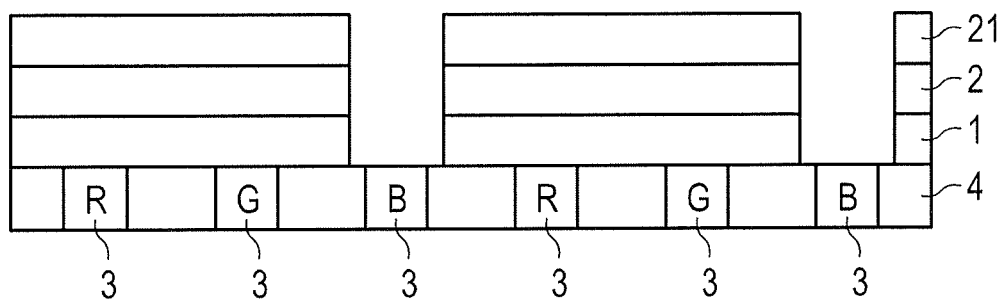

The radiation- and/or heat-sensitive layer 21 structured in this way is subsequently used as an etching mask for a wet-chemical or dry etching process. In this way, the first conversion layer 1 and the second conversion layer 2 are removed above the first subpixels B, as illustrated in FIG. 8D.

Figure 8E:
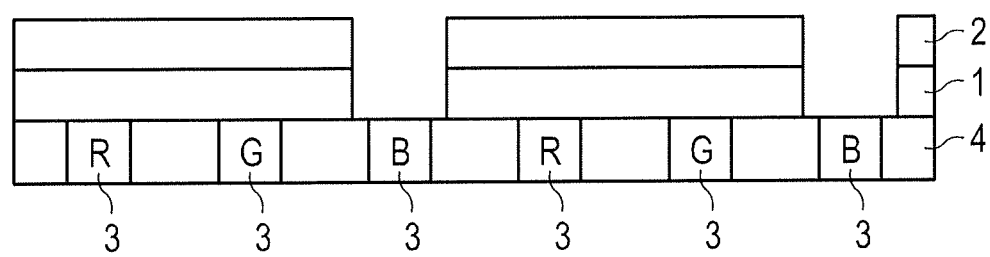

In a further step illustrated in FIG. 8E, the radiation- and/or heat-sensitive layer 21 is removed again.

Figure 8F:
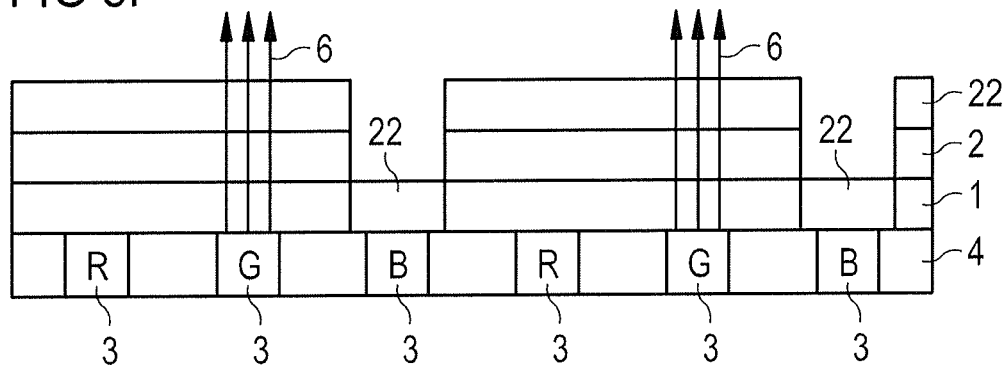
Figure 8G:
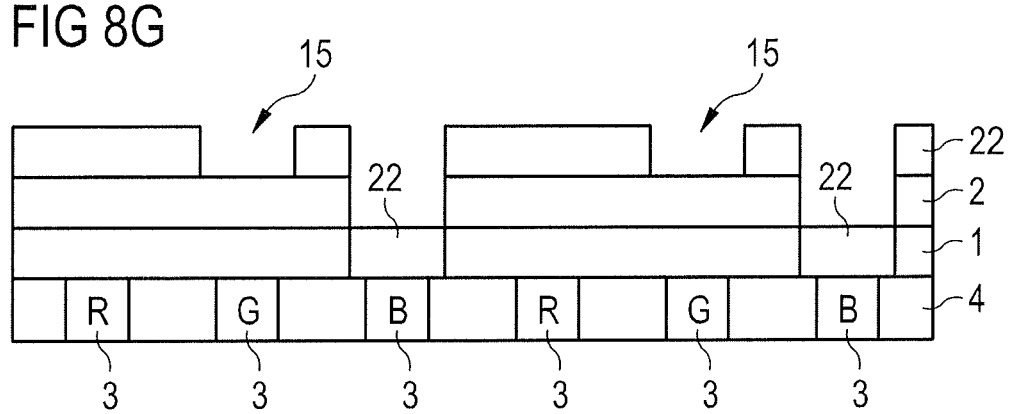

In the method step illustrated in FIG. 8F, a further radiation- and/or heat-sensitive layer 22 has been applied, which covers the first and second conversion layers 1, 2 and the first subpixels B previously uncovered. The LED chips 3 of the second subpixels G are subsequently electrically operated such that the further radiation- and/or heat-sensitive layer 22 is subjected to the action of the heat and/or radiation 6 emitted by the LED chips 3 of the second subpixels G. The radiation- and/or heat-sensitive layer 22 is subsequently structured, for example, by a development process such that it has openings 15 above the second subpixels G, as illustrated in FIG. 8G.

Figure 8H:
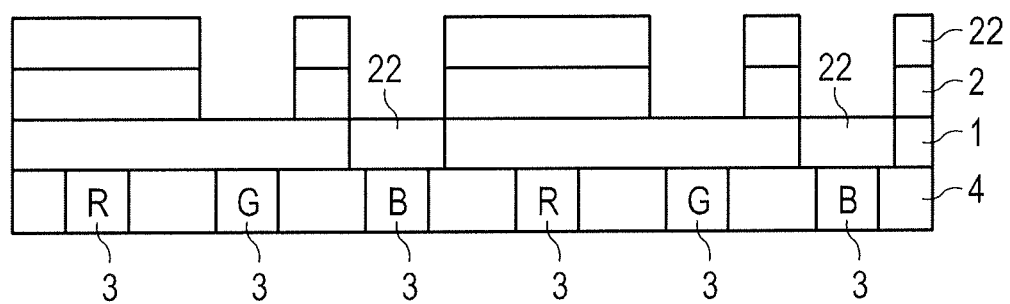

The radiation- and/or heat-sensitive layer 22 structured in this way is subsequently used as an etching mask for a wet-chemical or dry etching process. By the etching process, the second conversion layer 2 is removed above the second subpixels G, as illustrated in FIG. 8H.

Figure 8I:
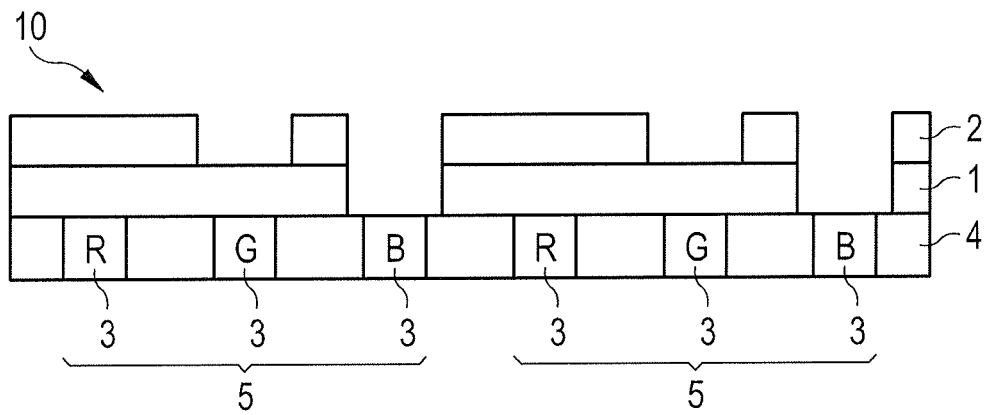

In a further step, illustrated in FIG. 8I, the further radiation- and/or heat-sensitive layer 22 is removed again. The multicolor LED display 10 completed in this way corresponds to the LED display illustrated in FIG. 1F.

Figure 9:
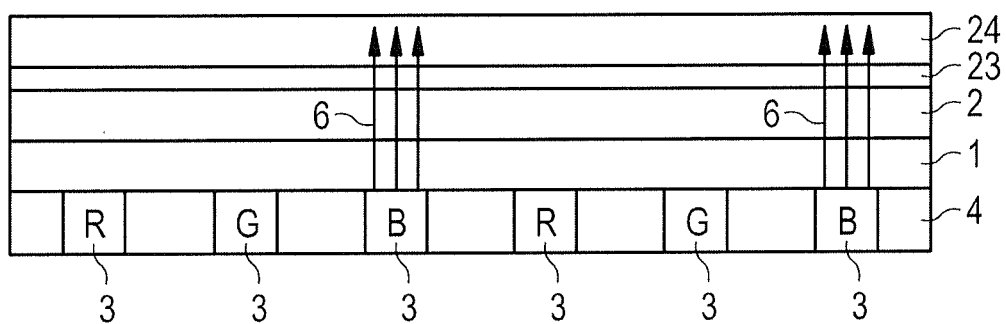
FIG. 9 shows a schematic illustration of the method in accordance with a further example on the basis of an intermediate step.
Figure 10:
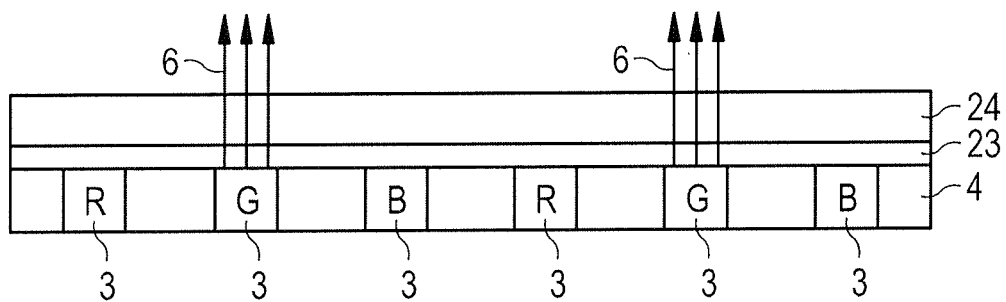
FIG. 10 shows a schematic illustration of the method in accordance with a further example on the basis of an intermediate step.

In a modification of the example in FIG. 8, instead of the application of the radiation- and/or heat-sensitive layer 21 illustrated in FIG. 8A, a radiation-absorbing layer 23 is applied, as illustrated in FIG. 9. A heat-sensitive layer 24 is applied to the radiation-absorbing layer 23. The radiation-absorbing layer 23 has the function, in particular, of converting the radiation 6 emitted by the operated LED chips 3 into heat such that the heat acts on the heat-sensitive layer 24. A layer sequence comprising a radiation-absorbing layer 23 and a heat-sensitive layer 24 can also be applied instead of the second radiation- and/or heat-sensitive layer in the further course of the method. The remaining method steps can be carried out analogously to the example in FIG. 8 and will therefore not be explained in greater detail again.

A layer sequence comprising a radiation-absorbing layer 23 and a heat-sensitive layer 24 can also be used instead of the photoresist layer in the above-described example in FIG. 5. In this case, the method step in FIG. 5A is replaced by the method step illustrated in FIG. 10 in which the radiation-absorbing layer 23 and the heat-sensitive layer 24 are applied to the LED luminous unit 4. A layer sequence comprising a radiation-absorbing layer 23 and a heat-sensitive layer 24 can also be applied instead of the second photoresist layer 14 in the further course of the method. The remaining method steps can be carried out analogously to the example in FIG. 5 and will therefore not be explained in greater detail again.

In all of the examples described above it is possible to apply a transparent protective layer, for example, composed of $SiO_2$ to the applied conversion layers 1, 2. The transparent protective layer is preferably applied to the multicolor LED display over the whole area.

In the examples described above, the method of producing the multicolor LED display was explained on the basis of the example of an RGB LED display. However, the multicolor LED display can also have other color combinations, in particular with more than three colors. It is also possible to use more than two conversion layers to generate the plurality of colors in the multicolor LED display.

Our methods are not restricted by the description on the basis of the examples. Rather, the disclosure encompasses any novel feature and also any combination of features, which in particular includes any combination of features in the appended claims, even if the feature or combination itself is not explicitly specified in the claims or examples.

The invention claimed is:

1. A method of producing a multicolor LED (light emitting diode) display comprising an LED luminous unit having a multiplicity of pixels, wherein:
   the pixels comprise first subpixels that emit a first color, second subpixels that emit a second color and third subpixels that emit a third color,
   the subpixels contain an LED chip that emits radiation of the first color,
   a first conversion layer that converts radiation of the first color into radiation of the second color is arranged at least above the second subpixels, and
   a second conversion layer that converts radiation of the first color and/or the radiation of the second color into radiation of the third color is arranged above the third subpixels, comprising:
      implementing at least one process step in which the first conversion layer or the second conversion layer is applied or removed in at least one defined region above the pixels to arrange the first conversion layer above the second subpixels and arrange the second conversion layer above the third subpixels,
      electrically operating in the process step a portion of the LED chips, and
      defining at least one region by electromagnetic radiation generated by the portion of the LED chips, generated heat or a generated electric field, wherein:
   a radiation- and/or heat-sensitive layer is applied and altered in regions by the radiation emitted by the portion of the LED chips and/or by the generated heat, and
   in the regions or outside the regions openings are produced in the radiation- and/or heat-sensitive layer.

2. The method according to claim 1, wherein the radiation- and/or heat-sensitive layer is a photoresist layer and the photoresist layer is exposed in the regions by the electromagnetic radiation emitted by the portion of the LED chips.

3. The method according to claim 1, wherein the radiation- and/or heat-sensitive layer is a heat-sensitive layer, and the heat sensitive layer is altered in the regions by the heat generated by the portion of the LED chips.

4. The method according to claim 3, wherein a radiation-absorbing layer is applied before the heat-sensitive layer is applied.

5. The method according to claim 1, wherein the first conversion layer or the second conversion layer is applied to the radiation- and/or heat-sensitive layer and is removed again outside the openings by lift-off technology.

6. The method according to claim 1, wherein the radiation- and/or heat-sensitive layer is applied to the first conversion layer or to the second conversion layer, and the first conversion layer or the second conversion layer is removed in the openings by a method of layer removal.

7. The method according to claim 6, wherein the method of layer removal is an etching process.

8. The method according to claim 7, wherein an electrically insulating layer is applied before the first and/or second conversion layer are/is applied, said electrically insulating layer being structured using a radiation- and/or heat- sensitive layer, and the radiation- and/or heat-sensitive layer is altered by the radiation generated by the portion of the LED chips and/or by the generated heat.

9. The method according to claim 8, wherein the radiation- and/or heat-sensitive layer is a photoresist layer and the photoresist layer is exposed by the electromagnetic radiation emitted by the portion of the LED chips.

10. The method according to claim 1, wherein the radiation- and/or heat sensitive layer is removed again after applying the first conversion layer and/or the second conversion layer.

11. A method of producing a multicolor LED (light emitting diode) display comprising an LED luminous unit having a multiplicity of pixels, wherein:
the pixels comprise first subpixels that emit a first color, second subpixels that emit a second color and third subpixels that emit a third color,
the subpixels contain an LED chip that emits radiation of the first color,
a first conversion layer that converts radiation of the first color into radiation of the second color is arranged at least above 1) the second subpixels and 2) above the LED luminous unit, and
a second conversion layer that converts radiation of the first color and/or the radiation of the second color into radiation of the third color is arranged above 1) the third subpixels and 2) the first conversion layer, comprising:
implementing at least one process step in which the first conversion layer or the second conversion layer is applied or removed in at least one defined region above the pixels to arrange the first conversion layer above the second subpixels and arrange the second conversion layer above the third subpixels,
electrically operating in the process step a portion of the LED chips, and
defining at least one region by electromagnetic radiation generated by the portion of the LED chips, generated heat or a generated electric field, wherein:
the second conversion layer is removed from the first subpixels and the second subpixels, and
the first conversion layer is removed from the first subpixels, and
removal of the first conversion layer and/or of the second conversion layer is effected by a method of local layer removal locally amplified by heat emitted by the portion of the LED chips and/or by electromagnetic radiation emitted by the portion of the LED chips.

12. The method according to claim 1, wherein removal of the first conversion layer and/or of the second conversion layer is effected by a method of local layer removal controlled by a spectrally sensitive optical recognition of the electromagnetic radiation emitted by the portion of the LED chips.

13. The method according to claim 12, wherein the method of local layer removal is laser ablation or an etching process.

14. The method according to claim 1, wherein the method of local layer removal is a wet-chemical etching method.

15. The method according to claim 1, wherein the removal of the first conversion layer and/or of the second conversion layer is effected by a method of local layer removal locally amplified by the electric field generated by the portion of the LED chips.

16. The method according to claim 15, wherein the method of local layer removal is a dry etching method.

17. The method according to claim 11, wherein the first conversion layer and/or the second conversion layer are/is deposited by electrophoresis, and the deposition is locally amplified by the electric field generated by the portion of the LED chips.

18. The method according to claim 11, wherein the pixels have a width of less than 100 µm.

* * * * *